United States Patent
Kato

(10) Patent No.: US 7,436,032 B2
(45) Date of Patent: Oct. 14, 2008

(54) SEMICONDUCTOR INTEGRATED CIRCUIT COMPRISING READ ONLY MEMORY, SEMICONDUCTOR DEVICE COMPRISING THE SEMICONDUCTOR INTEGRATED CIRCUIT, AND MANUFACTURING METHOD OF THE SEMICONDUCTOR INTEGRATED CIRCUIT

(75) Inventor: Kiyoshi Kato, Sagamihara (JP)

(73) Assignee: Semiconductor Energy Laboratory Co., Ltd., Kangawa-ken (JP)

(*) Notice: Subject to any disclaimer, the term of this patent is extended or adjusted under 35 U.S.C. 154(b) by 197 days.

(21) Appl. No.: 11/013,376

(22) Filed: Dec. 17, 2004

(65) Prior Publication Data

US 2005/0133790 A1 Jun. 23, 2005

(30) Foreign Application Priority Data

Dec. 19, 2003 (JP) ............................. 2003-423841

(51) Int. Cl.
- H01L 29/76 (2006.01)
- H01L 29/94 (2006.01)
- H01L 31/062 (2006.01)
- H01L 31/113 (2006.01)
- H01L 31/119 (2006.01)

(52) U.S. Cl. .................................................. 257/390

(58) Field of Classification Search .......... 257/390–392
See application file for complete search history.

(56) References Cited

U.S. PATENT DOCUMENTS

| | | | |
|---|---|---|---|
| 5,378,536 A | 1/1995 | Miller et al. | |
| 5,389,438 A | 2/1995 | Miller et al. | |
| 5,541,399 A | 7/1996 | De Vall | |
| 5,804,484 A * | 9/1998 | Wen | 438/278 |
| 5,973,598 A | 10/1999 | Beigel | |
| 6,168,829 B1 | 1/2001 | Russ et al. | |
| 6,424,011 B1 * | 7/2002 | Assaderaghi et al. | 257/350 |
| 6,440,773 B1 | 8/2002 | Usami | |

(Continued)

FOREIGN PATENT DOCUMENTS

CN 1452450 10/2003

(Continued)

OTHER PUBLICATIONS

"Sense of Crisis" is a Trigger Ignited Evolution of a Sesame-Grain Sized Chip Technology Development is Entering into the Second Phase, Nikkei Electronics, Nov. 8, 2002, No. 835, pp. 67-76.

(Continued)

*Primary Examiner*—Cuong Q Nguyen
(74) *Attorney, Agent, or Firm*—Eric J. Robinson; Robinson Intellectual Property Law Office, P.C.

(57) ABSTRACT

A chip with increased impact resistance, attractive design and reduced cost, and a manufacturing method thereof are provided. A semiconductor integrated circuit is formed on a large glass substrate, and a part of data of a ROM included therein is determined by an ink jet method or a laser cutting method. Accordingly, the cost can be reduced without requiring a photomask, resulting in an inexpensive ID chip. Further, depending on the application, the semiconductor integrated circuit is transposed to a flexible substrate, thereby an ID chip with improved impact resistance and more attractive design can be achieved.

26 Claims, 15 Drawing Sheets

U.S. PATENT DOCUMENTS

| | | |
|---|---|---|
| 6,445,450 B1 | 9/2002 | Matsumoto |
| 6,778,233 B2 | 8/2004 | Matsuura et al. |
| 6,871,339 B2 | 3/2005 | Hasei |
| 6,887,650 B2 | 5/2005 | Shimoda et al. |
| 7,159,241 B1 | 1/2007 | Horiguchi et al. |
| 7,271,076 B2 | 9/2007 | Yamazaki et al. |
| 2001/0015256 A1 | 8/2001 | Yamazaki et al. |
| 2001/0053559 A1 | 12/2001 | Nagao et al. |
| 2002/0093012 A1 | 7/2002 | Shimoji |
| 2003/0006121 A1 | 1/2003 | Lee et al. |
| 2003/0022403 A1 | 1/2003 | Shimoda et al. |
| 2003/0032210 A1 | 2/2003 | Takayama et al. |
| 2004/0016115 A1 | 1/2004 | Hashimoto |
| 2004/0026520 A1 | 2/2004 | Kawai et al. |
| 2004/0087110 A1 | 5/2004 | Takayama et al. |
| 2004/0128246 A1 | 7/2004 | Takayama et al. |
| 2004/0164302 A1 | 8/2004 | Arai et al |
| 2004/0256618 A1 | 12/2004 | Imai et al. |
| 2005/0106839 A1 | 5/2005 | Shimoda et al. |
| 2005/0116048 A1 | 6/2005 | Sauter et al. |
| 2005/0130389 A1 | 6/2005 | Yamazaki et al. |
| 2005/0133790 A1 | 6/2005 | Kato |
| 2005/0148121 A1 | 7/2005 | Yamazaki et al. |
| 2005/0287846 A1 | 12/2005 | Dozen et al. |
| 2007/0063057 A1 | 3/2007 | Masubuchi et al. |
| 2007/0166954 A1 | 7/2007 | Yamazaki et al. |

FOREIGN PATENT DOCUMENTS

| | | |
|---|---|---|
| EP | 0443263 | 8/1991 |
| EP | 0607709 | 7/1994 |
| EP | 1193759 | 4/2002 |
| JP | 05-159585 | 6/1993 |
| JP | 06-299127 | 10/1994 |
| JP | 09-142067 | 6/1997 |
| JP | 2992092 | 12/1999 |
| JP | 2001-030403 | 2/2001 |
| JP | 2001-260580 | 9/2001 |
| JP | 2001-272923 | 10/2001 |
| JP | 2001-284342 | 10/2001 |
| JP | 2002-343877 | 11/2002 |
| JP | 2003-203898 | 7/2003 |
| WO | WO-00/51181 | 8/2000 |
| WO | WO-03/010825 | 2/2003 |

OTHER PUBLICATIONS

International Search Report (Application No. PCT/JP2004/018978; PCT7574) Dated Mar. 15, 2005.

Written Opinion (Application No. PCT/JP2004/018978; PCT7574) Dated Mar. 15, 2005.

International Search Report (Application No. PCT/JP2005/001541; PCT7721) Dated Mar. 22, 2005.

Written Opinion (Application No. PCT/JP2005/001541; PCT7721) Dated Mar. 22, 2005.

Office Action (Application No. 200410094239.6) dated Apr. 4, 2008.

* cited by examiner

SEMICONDUCTOR INTEGRATED CIRCUIT COMPRISING READ ONLY MEMORY, SEMICONDUCTOR DEVICE COMPRISING THE SEMICONDUCTOR INTEGRATED CIRCUIT, AND MANUFACTURING METHOD OF THE SEMICONDUCTOR INTEGRATED CIRCUIT

BACKGROUND OF THE INVENTION

1. Field of the Invention

The present invention relates to a semiconductor integrated circuit formed on a glass substrate or a flexible substrate, a semiconductor device including the semiconductor integrated circuit, and a manufacturing method of the semiconductor integrated circuit.

2. Description of the Related Art

In recent years, there has been a great need for an IC card or an IC tag capable of contactless data communication in all fields that require automatic identification, such as securities and goods management. Such an IC card or an IC tag is required to be small for increased impact resistance, inexpensive for disposable application, an affinity for paper in view of the management of securities in particular, and a large capacity memory in accordance with the increased amount of data. Thus, the development of an IC chip on a silicon substrate has been advanced by using various technologies to meet such requirements.

It is also suggested that a minute IC chip is mounted on securities to prevent abuse thereof and to allow to be reused when they are returned to the owner (see Patent Document 1: Japanese Patent Laid-Open No. 2001-260580).

A chip formed on a silicon substrate has low impact resistance since the substrate has a single crystalline structure. In addition, since a chip formed on a silicon substrate is thick, irregularity occurs on the surface of products and goods, in particular when the chip is mounted on papers such as bills or on labels attached to the products and goods. As a result, the design of the products and goods becomes less attractive.

Further, a rewritable nonvolatile memory is not easily formed on a glass substrate because of the restriction on the process temperature and the like. Accordingly, it is practical to use a nonvolatile ROM such as a mask ROM data content of which is determined during the manufacturing step and cannot be rewritten. However, stored data is necessarily different in each chip, thus in the case of a mask ROM being used, a photomask used in the step for determining data content is thrown away after use, leading to the increase in the cost of the chip. Since the unit price of such a chip is extremely low, increased cost prohibits the spread thereof.

SUMMARY OF THE INVENTION

In view of the foregoing, the invention provides a semiconductor integrated circuit with increased impact resistance, attractive design and reduced cost, as well as a semiconductor device including the semiconductor integrated circuit. The invention further provides a manufacturing method of the semiconductor integrated circuit.

In view of the foregoing problems, according to the invention, a semiconductor integrated circuit for reading a nonvolatile memory included therein is formed on a large glass substrate instead of on an expensive silicon substrate. Further, according to the invention, a semiconductor device including the semiconductor integrated circuit (hereinafter referred to as an ID chip) can be formed on a glass substrate, resulting in reduction in cost.

Depending on the application of the ID chip, a semiconductor integrated circuit formed on a glass substrate can be transposed to a substrate with flexibility or directly to an object, resulting in an ID chip with increased impact resistance.

Note that in the invention, a substrate with flexibility is referred to as a flexible substrate. Typically, the flexible substrate includes a plastic substrate, paper and the like. The plastic substrate may be formed of polynorbornene with polar group, polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT), polyimide, or the like.

An ID chip may include an antenna as well as a semiconductor integrated circuit, by which data can be read wirelessly. The antenna included in the ID chip may be formed integrally with the semiconductor integrated circuit or connected through input/output terminals on the semiconductor integrated circuit. The ID chip may be a contact type including no antenna or may have both functions of contact type and contactless type. A contactless type ID chip is also called a wireless chip.

The ID chip can be mounted on a card or a tag to be used as a so-called IC card or IC tag (RFID). The ID chip can also be mounted on a seal, a card or a label with arbitrary forms, or incorporated into a container of goods. The main function of the ID chip is identification and management of stock and flow of goods, payment transaction, ID management, record management, and location management. An ID chip with a simple function can store and send identification data, while an ID chip with a complex one includes a CPU and has a processing function, a security function, a record storing function and the like.

According to the invention, a thin film integrated circuit comprises a ROM (Read Only Memory) and a photomask is not used in the step for determining data of the ROM. More specifically, a memory cell in the ROM is divided into a first memory cell and a second memory cell, at least one of which is formed without using a photomask to determine data content. For example, the first memory cell is connected to a wiring formed by using a photomask to determine data content, namely a typical manufacturing method of a mask ROM is adopted. Meanwhile, the second memory cell is connected to a wiring that is formed by a method of drawing a metal wiring using ink jet equipment (hereinafter referred to as an ink jet method or a droplet discharging method), or a wiring including a cut portion that is formed by a method of cutting a metal wiring by laser (hereinafter referred to as a laser cutting method), thereby data content is determined. The ink jet equipment means equipment that ejects a droplet containing a predetermined composition from a hole to obtain a predetermined pattern. A metal wiring material contained in a droplet can be selected from gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), aluminum (Al), or an alloy of them, dispersible nanoparticle of them, or silver halide microparticle.

In the droplet discharging method, a pattern of the conductive layer is formed by discharging metal droplet comprising nanoparticles (particles less than 10 nm) and solidifying so as to cause fusion and/or fused conjunction by performing bake. Although a pattern formed by sputtering method has columnar structure, a pattern formed by the droplet discharge method shows aggregate of grains formed by a plurality of fused particles (i.e. polycrystalline state).

An antenna may be formed by using the ink jet equipment. Any one of the metal wiring materials can be used for the antenna.

The first memory cell stores data common to substrates to be manufactured (first data) whereas the second memory cell stores data different between substrates to be manufactured (second data). According to the invention, not all the data common to substrates to be manufactured is required to be stored in the first memory cell, but all or a part of the data may be stored in the second memory cell. In the case of a large amount of data being common to substrates to be manufactured, however, it is preferably stored in the first memory cell in terms of throughput.

The first data includes, among identification serial numbers, lower bit data representing the number of chips manufactured in the same substrate, and fixed data such a model number of the chip. Meanwhile, the second data includes, among identification serial numbers, higher bit data different between substrates. The first memory cell and the second memory cell may be formed of one ROM or different ROMs.

According to the invention, a photomask is not required to be thrown away after use and the increase in the cost can be suppressed as compared with in the case of all the data in ROMs being determined by a photomask. In addition, a metal wiring is drawn by a droplet discharging method, resulting in improved efficiency of material utilization, cost reduction, and a smaller amount of waste liquid to be treated. As a result, the cost of equipment investment and the production time can be reduced, resulting in the cost reduction of an ID chip.

As a result, an ID chip with increased impact resistance can be provided at low cost.

The ID chip of the invention is formed on a glass substrate or the like, therefore, the cost thereof can be reduced as compared with the one using a conventional silicon wafer. As for an integrated circuit with extremely low unit price such as an ID chip, the cost reduction leads to great profits.

According to the invention, the ink jet method or the laser cutting method of a metal wiring is adopted for the step of determining ROM data. Therefore, a photomask is not required to be thrown away after use in the step of determining ROM data, resulting in an ID chip with lower cost.

Further, depending on the application of the ID chip, a semiconductor integrated circuit formed on a glass substrate is transposed to a flexible substrate, resulting in an ID chip with increased impact resistance.

Moreover, according to the invention, information exchange or information management can be performed more simply and in a shorter time, and various information can be provided as compared with an information providing means such as a bar code. In addition, a semiconductor integrated circuit included in the ID chip of the invention is much thinner than a conventional one using a silicon wafer, thus an attractive design thereof can be maintained even when it is attached to a container of goods.

DETAILED DESCRIPTION OF THE INVENTION

Figure 1:
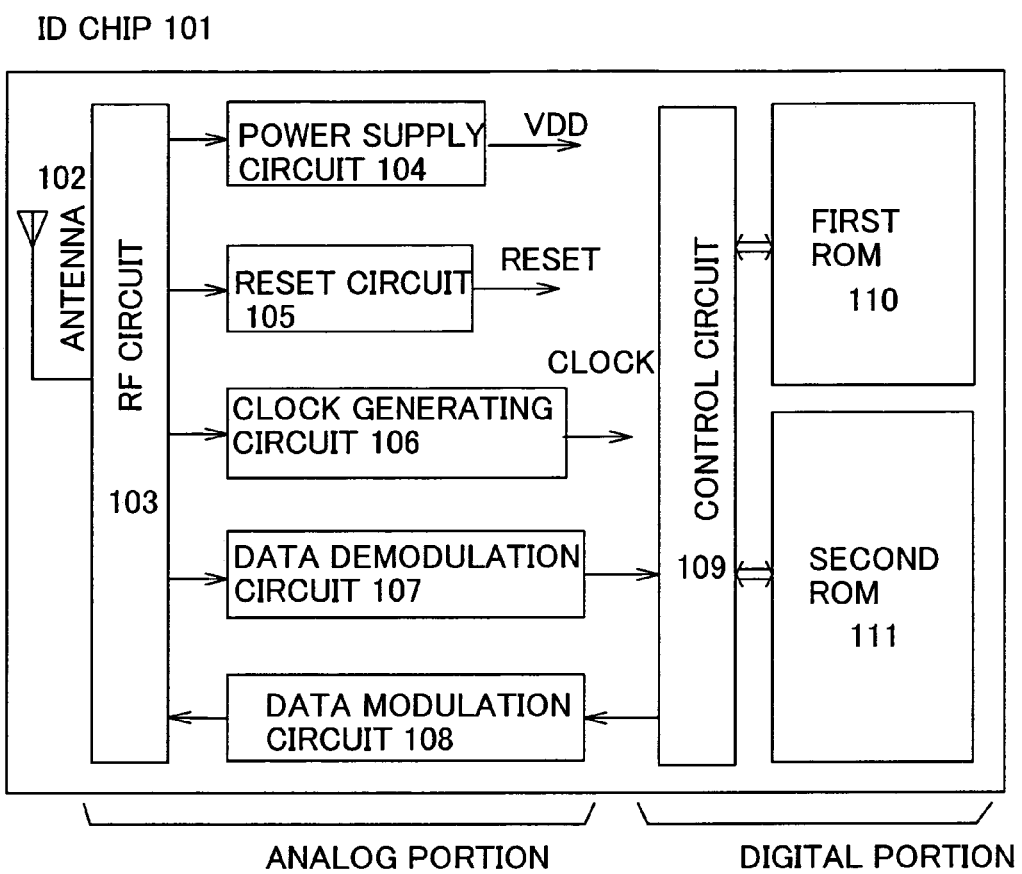
FIG. 1 shows a block diagram of an ID chip.

Although the present invention will be described by way of Embodiment Modes with reference to the accompanying drawings, it is to be understood that various changes and modifications will be apparent to those skilled in the art. Therefore, unless such changes and modifications depart from the scope of the invention, they should be constructed as being included therein. Note that in the drawings used for describing Embodiment Modes, the identical portions or the portions with the identical function are denoted by the same reference numerals among all the drawings, and will be explained in no more details.

The ID chip of the present invention having, for example, includes an RF circuit, a power source circuit, a clock generator circuit, and a ROM for storing identification data as the most simple configuration, and has only a function to identify individually while utilizing network technologies such as Internet to compensate for the lack of functions. Meanwhile, the ID chip having a complex configuration additionally includes, for example, a CPU and a congestion control circuit for individually identifying a plurality of ID chips within the same radio wave spectrum, and incorporates a security function and a processing function.

A first feature of the ID chip of the invention is to form a semiconductor integrated circuit on a glass substrate and transpose it on a flexible substrate depending on the application of the ID chip. A second feature is to use a nonvolatile ROM that cannot be rewritten. A third feature is to adopt the ink jet method or the laser cutting method as well as the step using a common photomask in order to form a memory cell for storing at least chip specific data among data included in the ID chip.

The first feature of the invention will be described in Embodiment 4. Described hereinafter are the second and third features of the invention.

In the ID chip of the invention, a memory cell for storing fixed data is preferably divided into two memory cells, to which different manufacturing methods are applied. A first memory cell stores data common to substrates whereas a second memory cell stores data different between substrates.

The first memory cell is manufactured by normal mask ROM manufacturing steps. Meanwhile, the second memory cell adopts the ink jet method or the laser cutting method in the manufacturing steps for achieving different layouts in each substrate (typically, a forming step of a metal wiring and a cutting step thereof).

FIG. 1 shows a block diagram of the ID chip of the present invention. Shown in FIG. 1 is a simple configuration having a function to read only fixed data such as identification data. In FIG. 1, an ID chip 101 includes an antenna 102, an RF circuit 103, a power source circuit 104, a reset circuit 105, a clock generator circuit 106, a data demodulation circuit 107, a data modulation circuit 108, a control circuit 109, a first ROM 110, and a second ROM 111.

In FIG. 1, the first ROM 110 is a mask ROM configured by the first memory cell whereas the second ROM 111 is a mask ROM configured by the second memory cell. The first ROM 110 stores data common to substrates while the second ROM 111 stores data different between substrates.

The first memory cell and the second memory cell are formed of different ROMs in FIG. 1, though they may be formed of the same ROM. In general, the first memory cell and the second memory cell have different design rules, thus they are preferably formed by different manufacturing steps and formed of different ROMs as shown in FIG. 1 in order to improve frequency characteristics and operating margin. On the other hand, in the case where one of the two memory cells requires a small number of unit memory cells, the two memory cells are preferably formed of the same ROM in view of the area efficiency.

All the circuits shown in FIG. 1 are formed on a glass substrate or a flexible substrate. The antenna 102 may also be formed on the glass substrate or the flexible substrate, or may be formed outside the substrate and connected to the semiconductor integrated circuit inside the substrate.

The RF circuit 103 receives an analog signal from the antenna 102 and outputs to the antenna 102 an analog signal received from the data demodulation circuit 108. The power source circuit 104 generates a constant power source from a received signal. The reset circuit 105 generates a reset signal while the clock generator circuit 106 generates a clock signal. The data demodulation circuit 107 extracts data from a received signal. The data modulation circuit 108 generates an analog signal to be outputted to the antenna 102 or changes the antenna properties based on a digital signal received from the control circuit 109. Such circuits configure an analog portion.

The control circuit 109 receives and reads data extracted from a received signal. Specifically, the control circuit 109 generates an address signal of the first ROM 110 and the second ROM 111 and a ROM selection signal, reads data, and sends the read data to the data demodulation circuit 108. Such circuits configure a digital portion.

Figure 2:
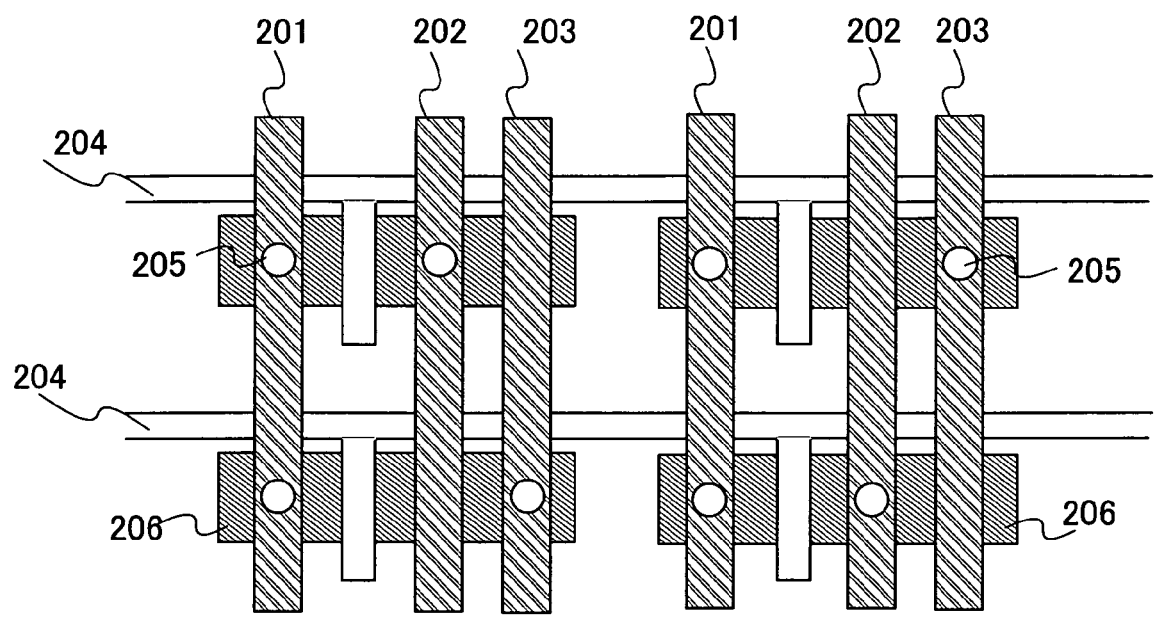
FIG. 2 shows a memory cell layout in the case of data being determined in a contact process.

Since the first ROM 110 stores data independent of the substrate, it may be formed by normal mask ROM manufacturing steps. For example, in the case of data being determined by a contact step, a memory cell layout as shown in FIG. 2 can be adopted. FIG. 2 shows four memory cells each of which includes a bit line 201, a VDD 202, a GND 203, a word line 204, and a semiconductor film 206. In the layout of a mask ROM when determining data in the contact step, the bit line 201 overlaps one of two high density impurity regions of a TFT configuring the memory cell, while the VDD 202 and the GND 203 overlap the other thereof. Since the bit line 201 is a data read path, it is short-circuited to the semiconductor film 206 via a contact hole 205.

For example, data is 0 in the case of a read potential being GND while data is 1 in the case of a read potential being VDD. So, whether data is 0 or 1 can be determined in accordance with whether the contact hole 205 is formed under the VDD 202 or the GND 203 since both the VDD 202 and the GND 203 overlap one of the two high density impurity regions of a TFT. In other words, when 0 is stored as data, the contact hole 205 is formed under the GND 203 to be short-circuited to the semiconductor film 206, meanwhile, when 1 is stored as data, the contact hole 205 is formed under the VDD 202 to be short-circuited to the semiconductor film 206.

It is needless to say that data can be determined in a wring step or a patterning step of a semiconductor film. In the first ROM 110, a photomask is used in a step for determining data content.

On the other hand, in the second ROM 111, a photomask is not used but the ink jet method or the laser cutting method is adopted in a step for manufacturing different wirings connected to memory cells in each substrate. In the case of the ink jet method being adopted, for example, a drawing program may be prepared for a layout as shown in FIGS. 3A to 3C.

Figure 3A:
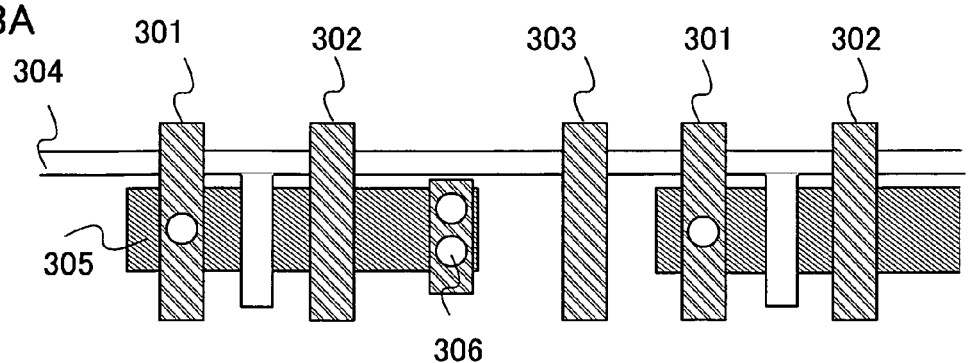
FIGS. 3A to 3C show memory cell layouts in the case of data being determined by an ink jet method.
Figure 3B:
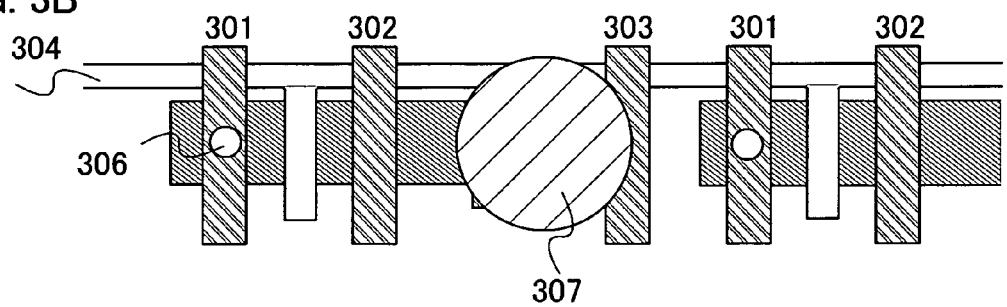

FIG. 3A shows a memory cell layout for the ink jet method. One memory cell includes a bit line 301, a VDD 302, a GND 303, a word line 304, and a semiconductor film 305. In the case of data being determined by the ink jet method, the bit line 301 as a data read path, which overlaps one of the two high density impurity regions of a TFT, has a contact hole 306 and is short-circuited to the semiconductor film 305. On the other hand, the VDD 302 and the GND 303 are not short-circuited to the semiconductor film 305, though the contact hole 306 is formed in the other of the two high density impurity regions of a TFT.

For example, it is assumed that data is 0 in the case of a read potential being GND while data is 1 in the case of a read potential being VDD. FIG. 3B shows a condition in which memory cell data is set to 0 by using the ink jet method. By forming the metal wiring 307 using the ink jet method, a metal wiring of the GND 303 is short-circuited to one of the two high density impurity regions which is not short-circuited to the bit line 301 in the semiconductor film 305 of a TFT configuring the memory cell. As a result, the memory content is set to 0.

Figure 3C:
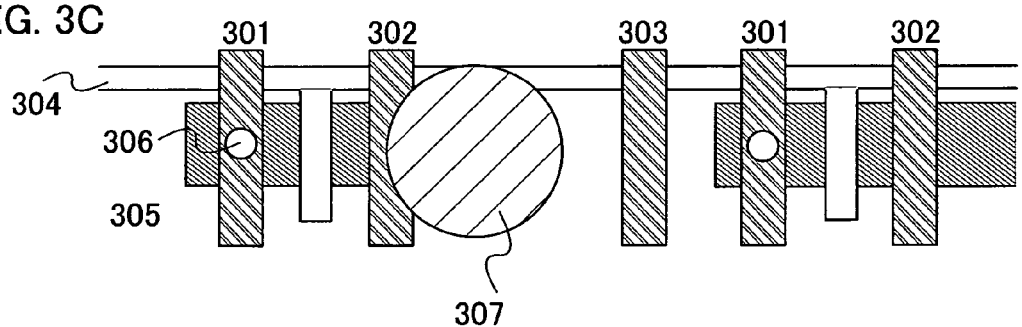

FIG. 3C shows a condition in which memory cell data is set to 1 by using the ink jet method. By forming the metal wiring 307 using the ink jet method, a wiring of the VDD 302 is short-circuited to one of the two high density impurity regions which is not short-circuited to the bit line 301 in the semiconductor film 305 of a TFT configuring the memory cell. As a result, the memory cell content is set to 1.

Data of a metal wiring drawn by the ink jet method may be entered into the drawing program in advance. Accordingly, predetermined data of each substrate can be stored only by changing a part of the drawing program, and a photomask can be prevented from being thrown away after use. Note that it is important to design entire circuits so as to satisfy the design rule and limitation suitable for the ink jet method.

In order to connect different wirings to a memory cell in each substrate, a contact may be formed by the ink jet method.

Figure 4A:
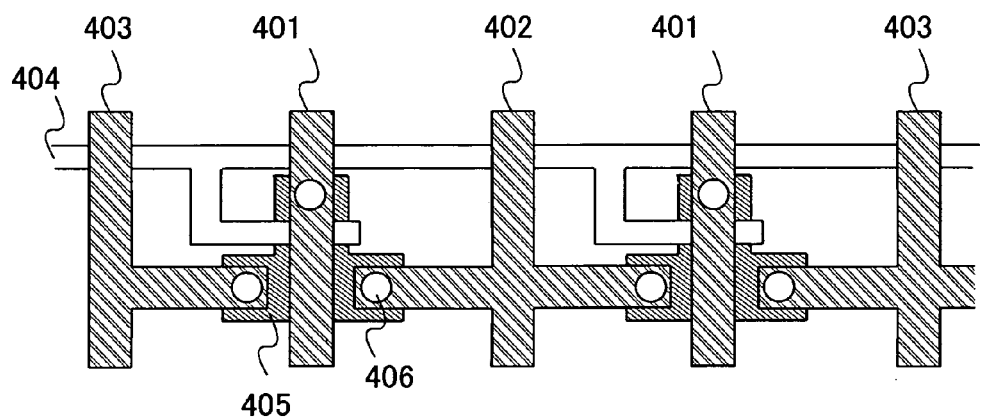
FIGS. 4A to 4C show memory cell layouts in the case of data being determined by a laser cutting method.
Figure 4B:
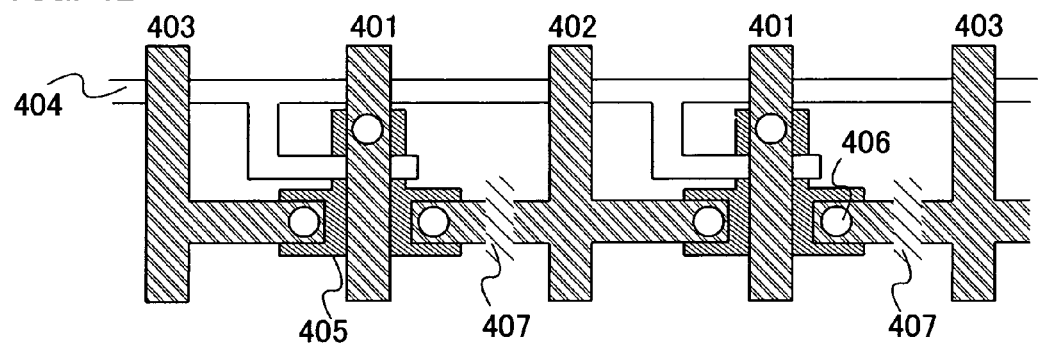
Figure 4C:
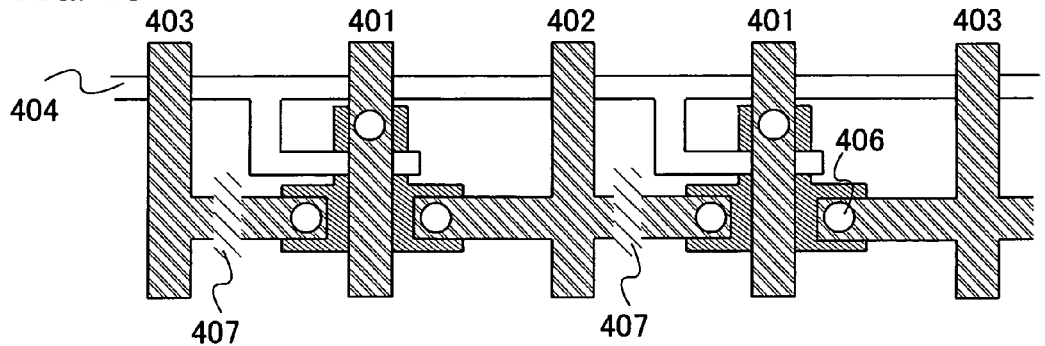

In the case of the laser cutting method being adopted, a layout as shown in FIGS. 4A to 4C is formed for example. FIG. 4A shows a memory cell layout for the laser cutting method. One memory cell includes a bit line 401, a VDD 402, a GND 403, a word line 404, and a semiconductor film 405. In the case of data being determined by the laser cutting method, the bit line 401 overlaps one of two high density impurity regions of a TFT, has a contact hole 406 and is short-circuited to the semiconductor film 405 as a data read path. On the other hand, both the VDD 402 and the GND 403 are short-circuited to the other of the two high density impurity regions of the TFT. In FIGS. 4B to 4C, a portion cut by the laser cutting method is referred to as a laser cutting portion 407.

For example, data is 0 in the case of a read potential being GND while data is 1 in the case of a read potential being VDD. FIG. 4B shows a condition in which memory cell data is set to 0 by using the laser cutting method. When cutting a metal wiring of the VDD 402 connected to one of the two high density impurity regions of a TFT configuring a memory cell by the laser cutting method, only the GND 403 is short-circuited to the one of the two high density impurity regions of the TFT. As a result, the memory content is set to 0.

FIG. 4C shows a condition in which memory cell data is set to 1 by using the laser cutting method. When cutting a metal wiring of the GND 403 connected to one of the two high density impurity regions of a TFT configuring the memory cell by the laser cutting method, only the VDD 402 is short-circuited to the one of the two high density impurity regions of the TFT. As a result, the memory cell content is set to 1.

Data of a metal wiring to be cut by the laser cutting method may be entered into the program in advance. Accordingly, predetermined data of each substrate can be stored only by laser cutting after the manufacturing of a TFT, and a photomask can be prevented from being thrown away after use. Needless to say, it is important to design entire circuits so as to satisfy the design rule and limitation suitable for the laser cutting method.

In order to connect different wirings to a memory cell in each substrate, both the ink jet method and the laser cutting method may be adopted in the manufacturing steps of the second ROM.

By determining data in ROMs as described above, it is possible to prevent a photomask from being thrown away after use and to provide an ID chip at low cost.

EMBODIMENTS

Embodiments of the invention are described below with reference to the accompanying drawings. Note that in the drawings used for describing Embodiments, the identical portions or the portions with the identical function are denoted by the same reference numerals among all the drawings, and will be explained in no more details.

Embodiment 1

Described in this embodiment is a memory cell example that configures a ROM using a precharge method.

Figure 5A:
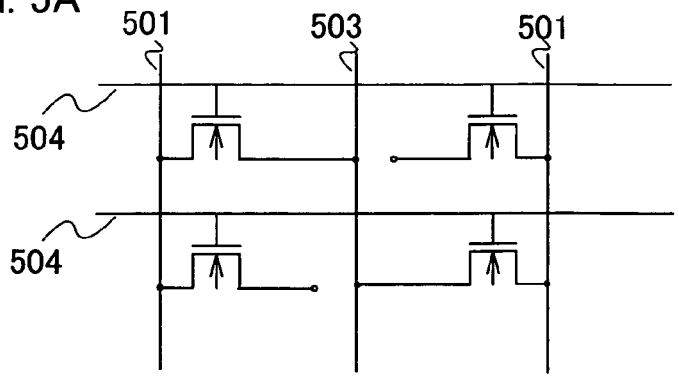
FIGS. 5A to 5C show diagrams showing a ROM adopting a precharge method.

FIG. 5A is a circuit diagram of a memory cell of a ROM using the precharge method. Each TFT in the memory cell is connected to a bit line 501 and a word line 504. One of two high density impurity regions of a TFT may be or not be connected to a GND 503 depending on data content.

For example, data is 0 in the case of a read potential being GND while data is 1 in the case of a read potential being VDD. In the case of a ROM adopting the precharge method, one of the two high density impurity regions of a TFT in a memory cell is connected to the GND or brought into a floating state. Therefore, a VDD wiring is not required in a memory cell array, resulting in reduction in the memory cell area.

Figure 5B:
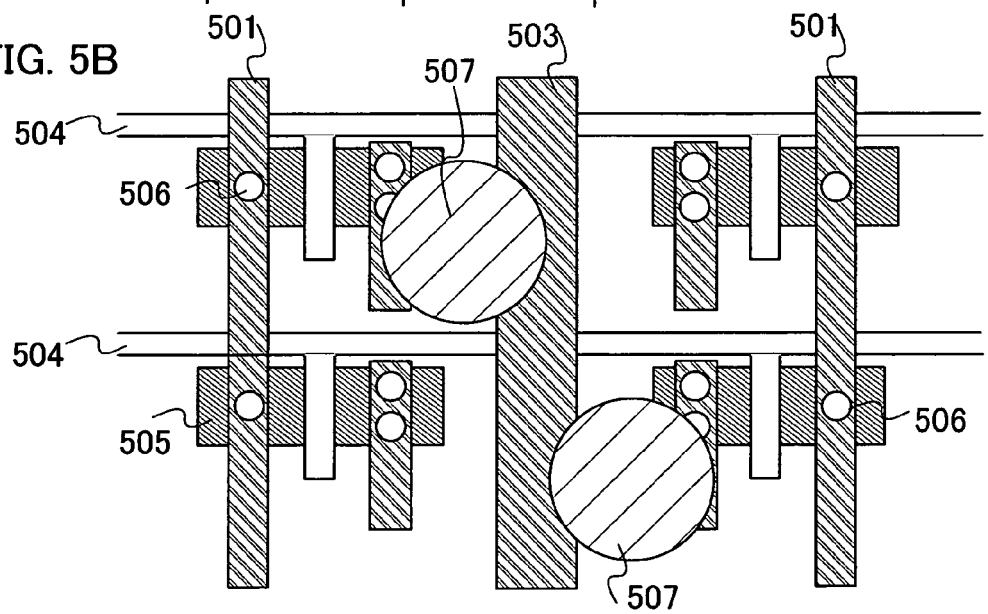

FIG. 5B is an example of a memory cell layout in the case of data content of a ROM adopting the precharge method being determined by the ink jet method. A memory cell includes the bit line 501, the GND 503, the word line 504, and a semiconductor film 505. The bit line 501 has a contact hole 506 and is short-circuited to the semiconductor film 505 as a data read path. When data 0 is required, as shown in FIG. 5B, the GND 503 is short-circuited to one of the two high density impurity regions of a TFT by the ink jet method. Meanwhile, when data 1 is required, one of the two high density impurity regions of the TFT is brought into a floating state. A portion obtained by the ink jet method is referred to as an ink jet portion 507.

Figure 5C:
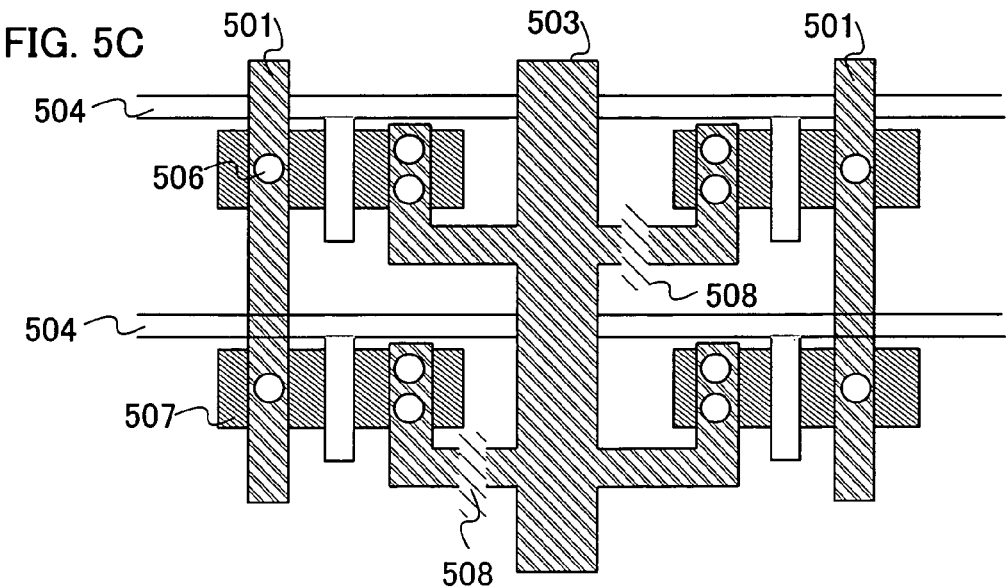

FIG. 5C is an example of a memory cell layout in the case of data content of a mask adopting the precharge method being determined by the laser cutting method. A TFT of a memory cell is connected to the bit line 501, the GND 503, and the word line 504. When data 0 is required, one of the two high density impurity regions of a TFT is connected to the GND 503 without any change. Meanwhile, when data 1 is required, one of the two high density impurity regions of the TFT is brought into a floating stated by cutting a metal wiring by the laser cutting method. A portion cut by the laser cutting method is referred to as a laser cutting portion 508.

Data of a metal wiring to be short-circuited by the ink jet method and data of a metal wiring to be cut by the laser cutting method may be entered into the program in advance. Needless to say, it is important to design entire circuits so as to satisfy the design rule and limitation suitable for the ink jet method and the laser cutting method.

This embodiment can be implemented in combination with other embodiments.

Embodiment 2

Described in this embodiment is a configuration example of a systemized ID chip.

Figure 6:
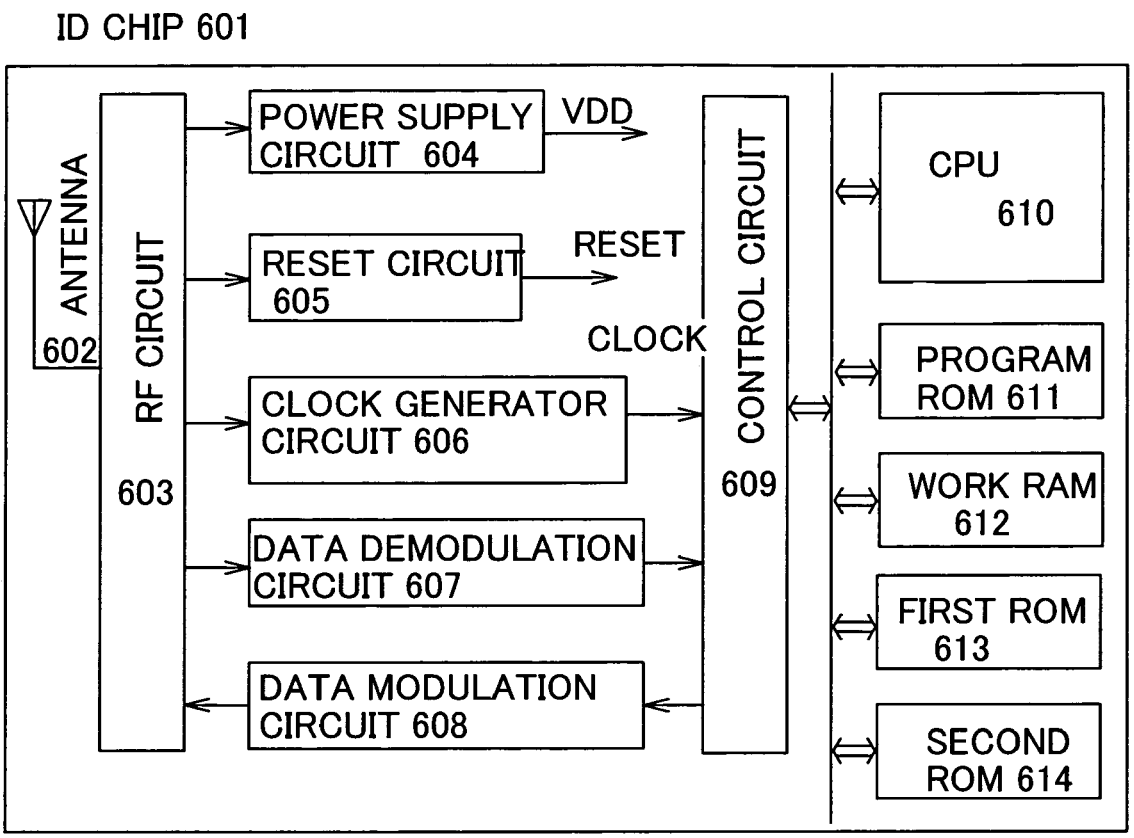
FIG. 6 shows a block diagram of a systemized ID chip.

The invention can be applied to a high performance ID chip including a logic circuit such as a CPU. FIG. 6 shows a configuration example of such an ID chip. In FIG. 6, an ID chip 601 includes an antenna 602, an RF circuit 603, a power source circuit 604, a reset circuit 605, a clock generator circuit 606, a data demodulation circuit 607, a data modulation circuit 608, a control circuit 609, a CPU 610, a program ROM 611, a work RAM 612, a first ROM 613, and a second ROM 614.

The semiconductor integrated circuit shown in FIG. 6 is formed on a glass substrate or a flexible substrate. The antenna 602 may also be formed on the glass substrate or the flexible substrate, or may be formed outside the substrate and connected to the semiconductor integrated circuit inside the substrate.

Since the ID chip shown in FIG. 6 includes the CPU 610, it can incorporate various functions in addition to the transmission of identification data. For example, the CPU 610 executes programs stored in the program ROM 611, thus a security function can be incorporated such as verification of passwords, management of access to the data, and coding/decoding processing. Further, although not shown in FIG. 6, the ID chip may include a dedicated hardware for increased processing speed of complex coding/decoding.

When such a semiconductor integrated circuit configuring the high performance ID chip is formed on a silicon substrate, a circuit area is increased and impact resistance is decreased, leading to limited application range. According to the invention, however, the semiconductor integrated circuit can be transposed to a flexible substrate depending on the application of the ID chip. Thus, impact resistance can be increased even when a circuit area is somewhat increased, thereby the ID chip with a wide application range can be achieved.

This embodiment can be implemented in combination with other embodiments.

Embodiment 3

Described in this embodiment is a specific example of data common to substrates (first data) and data different between substrates (second data) according to the invention.

Figure 7A:
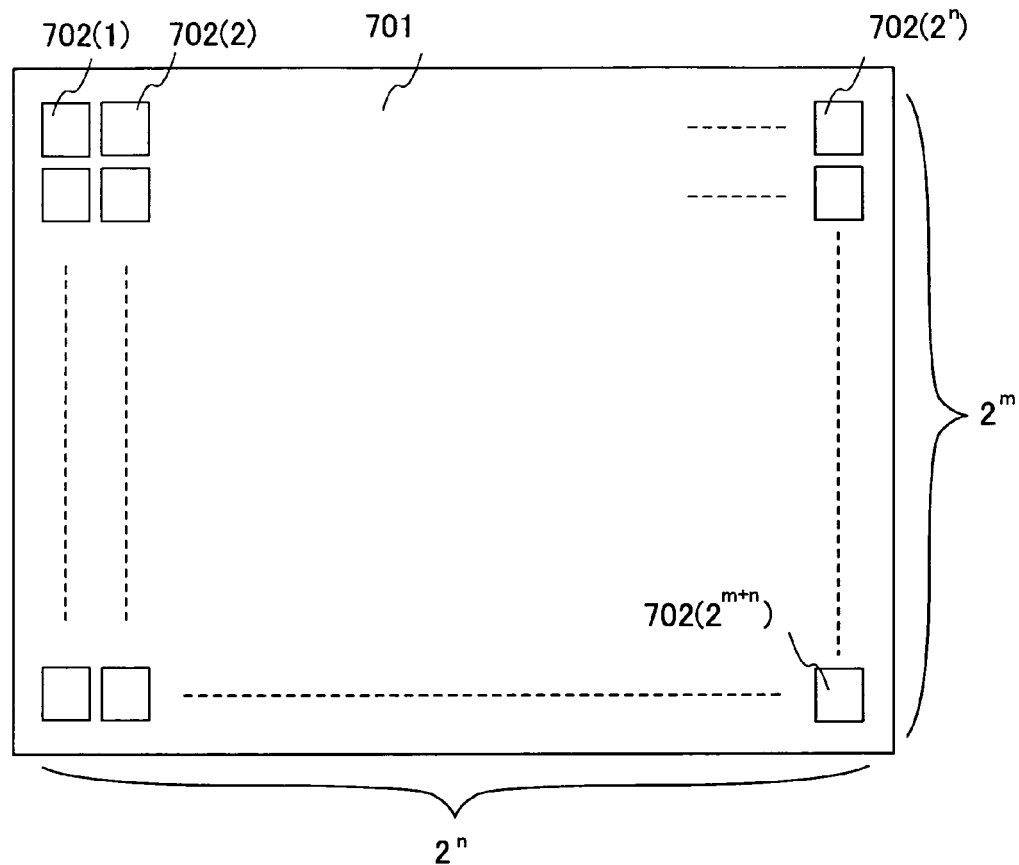
FIGS. 7A to 7C show diagrams showing identification numbers.

FIG. 7A shows an example of a glass substrate 701 that includes $2^{m+n}$ ID chips 702 arranged in $2^m$ columns and $2^n$ rows (m and n are positive integers). Each of the ID chips 702 is sequentially assigned a number of 702 (1), 702 (2), ..., 702 ($2^{m+n}$).

Figure 7B:
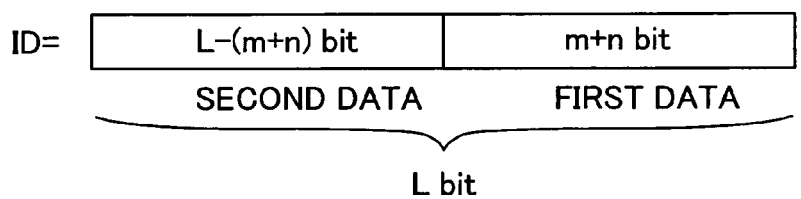

Each of the ID chips includes L-bit identification serial data as shown in FIG. 7B. The lower m+n bits represent first data common to substrates, which is stored in a first ROM whose data content is determined by a step using a photomask. The upper L−(m+n) bits represent second data different between substrates, which is stored in a second ROM whose data content is determined by the ink jet method or the laser cutting method.

Figure 7C:
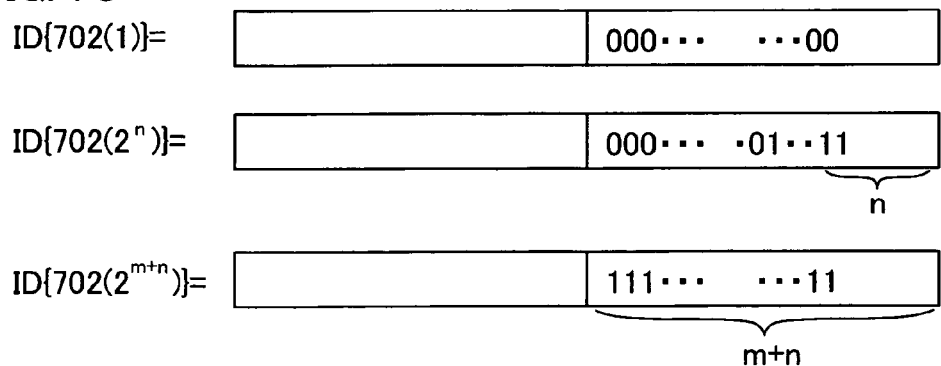

FIG. 7C shows first data content of the lower bits. The data common to substrates has to be different between chips in each of the substrates, thus (m+n)-bit area is required. When the content of the first data in the N-th chip represent as ID {702 (N)}, a formula "ID {702 (N)}=N−1" is satisfied, and it can be expressed in binary form corresponding to the data content of a ROM as shown in FIG. 7C.

Note that this embodiment shows a configuration in which one substrate includes $2^{m+n}$ ID chips 702 for simplicity, though the invention is not limited to this. Further, this embodiment can be implemented in combination with other embodiments.

Embodiment 4

Described in this embodiment is a manufacturing method of a semiconductor integrated circuit included in the ID chip of the invention, and in particular a step of transposing the semiconductor integrated circuit to a flexible substrate.

Described in this embodiment is a manufacturing method comprising the steps of forming an integrated circuit on a glass substrate by using a crystallized semiconductor film, and transposing it to a flexible substrate. Note that a TFT is taken as an example of a semiconductor element in this embodiment, though the invention can also be applied to other semiconductor elements such as a memory element, a diode, a photoelectric converter, a resistor element, a coil, a capacitor element, and an inductor.

Figure 8A:
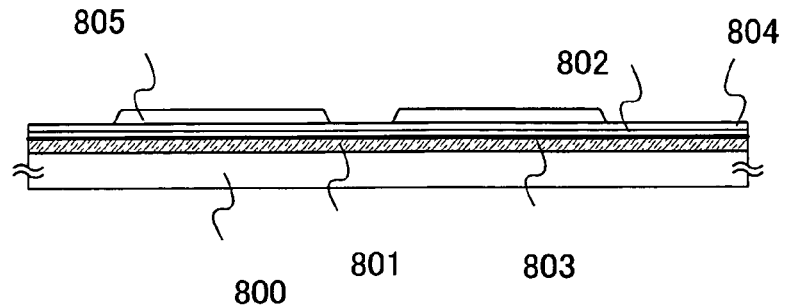
FIGS. 8A to 8C show cross sectional views showing steps of transposing an ID chip to a flexible substrate.

First, as shown in FIG. 8A, a metal film 801 and an oxide film 802 are formed so as to stack in this order over a substrate 800 by sputtering. Since a presputtering is performed when forming the oxide film 802, a surface of the metal film 801 is oxidized and an ultrathin metal oxide film 803 is formed between the metal film 801 and the oxide film 802. Then, after forming a base film 804 and a semiconductor film, the semiconductor film is crystallized by laser light and patterned, thereby an island-like semiconductor film 805 is obtained. A gate insulating film 807 is formed so as to cover the island-like semiconductor film 805. Subsequently, a conductive film is formed on the gate insulating film 807 and patterned to form a gate electrode 808. Then, an impurity that imparts N-type conductivity is added to the island-like semiconductor film 805 to form a source region, a drain region and the like. Note that although N-type TFTs 806 are formed herein, a P-type TFT may also be used by adding an impurity that imparts P-type conductivity.

The TFTs 806 can be obtained by the aforementioned steps, however, a manufacturing method of the TFT is not limited to these. For example, as laser light, continuous wave laser (CW laser) or pulsed laser (pulse laser) can be used. As the laser, one or more of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser can be used. The beam preferably has a linear shape and has a long axis of 200 to 350 μm in length. In addition, the laser may have an incident angle θ relative to the semiconductor film (0<θ<90°).

A fundamental wave of continuous wave laser light and a harmonic of a continuous wave laser light may be irradiated. Alternatively, a fundamental wave of continuous wave laser light of and a harmonic of pulsed laser light of may also be irradiated.

Laser with a frequency of 10 MHz or more may also be irradiated. A semiconductor film with high crystallinity can be obtained by high-frequency laser as well as a continuous wave laser.

Instead of laser light, a furnace may be used for the crystallization. In that case, a metal element such as Ni that promotes the crystallization allows the crystallization to be performed at a low temperature.

When a quartz substrate is used, a crystalline semiconductor film can be directly formed thereon. Depending on a material gas, a crystalline semiconductor film can be formed directly on a glass substrate. In that case, fluorine gas such as $GeF_4$ and $F_2$ and silane gas such as $SiH_4$ and $Si_2H_6$ are used and a crystalline semiconductor film is formed directly on a surface by utilizing heat or plasma.

Next, a first interlayer insulating film 809 is formed so as to cover the TFTs 806. After forming a contact hole in the gate insulating film 807 and the first interlayer insulating film 809, a wiring 810 connected to the TFT 806 via the contact hole is formed so as to be in contact with the first interlayer insulating film 809.

A manufacturing method using the ink jet method, which is a feature of the invention, will be described in Embodiment 6. In this embodiment, only a normal forming method of a metal wiring is explained.

Subsequently, a second interlayer insulating film 811 is formed over the first interlayer insulating film 809 so as to cover the wiring 810. In the case where an antenna formed outside the substrate is required to be connected, a contact hole is formed in the second interlayer insulating film 811 and a pad 812 connected to the wiring 810 via the contact hole is formed on the second interlayer insulating film 811.

Figure 8B:
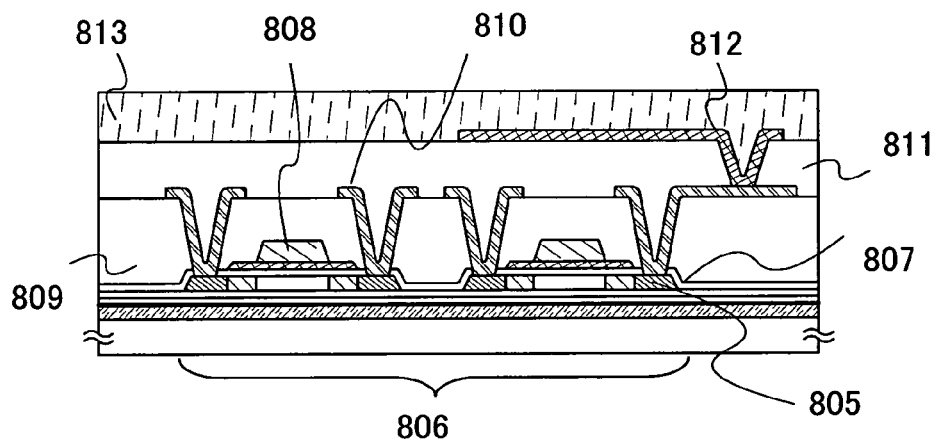
Figure 8C:
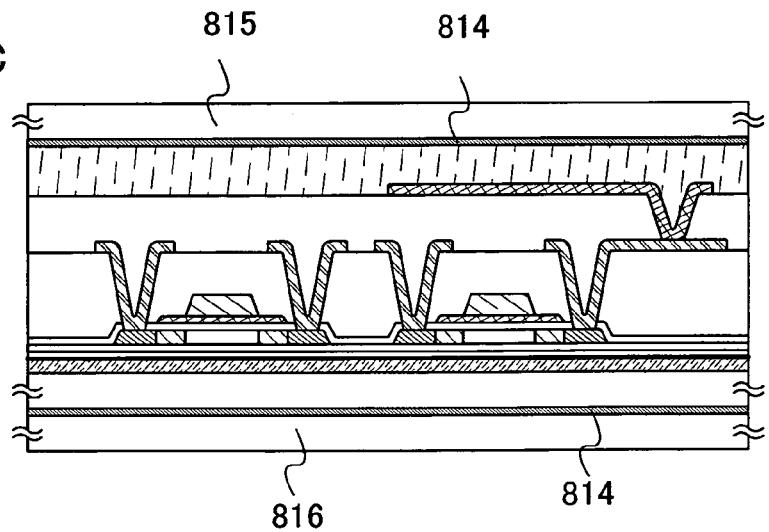

A protective layer 813 is formed over the second interlayer insulating film 811 and the pad 812 (FIG. 8B). Then, the metal oxide film 803 is crystallized in order to facilitate the subsequent peeling step. With a couple-face tape 814, a second substrate 815 is attached to the protective layer 813 and a third substrate 816 is attached to the substrate 800 (FIG. 8C). The third substrate 816 prevents the substrate 800 from being damaged in the subsequent peeling step.

Figure 9A:
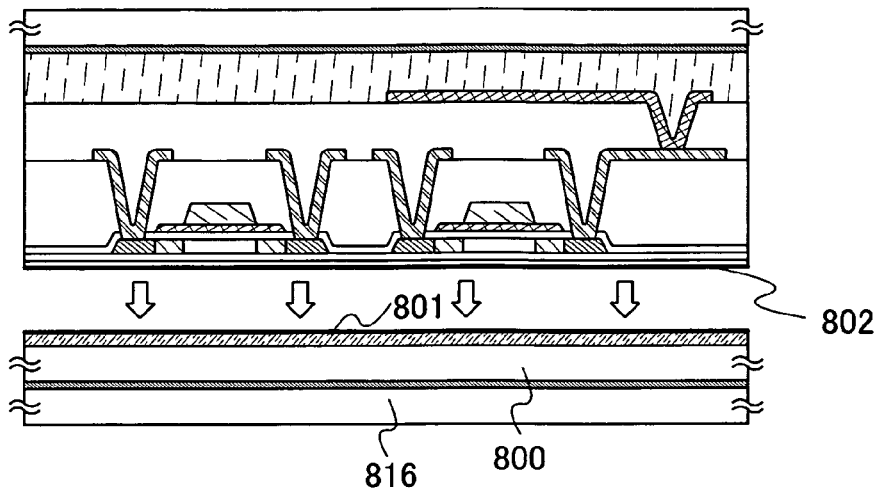
FIGS. 9A to 9C show cross sectional views showing steps of transposing an ID chip to a flexible substrate.
Figure 9B:
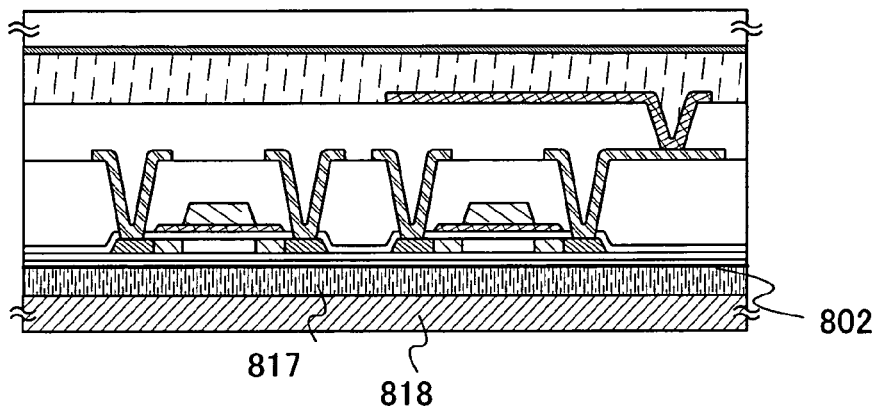

The metal film 801 is detached from the oxide film 802 physically. FIG. 9A shows a condition after the peeling step. Subsequently, a flexible substrate 818 is attached to the oxide film 802 with an adhesive 817 (FIG. 9B).

Figure 9C:
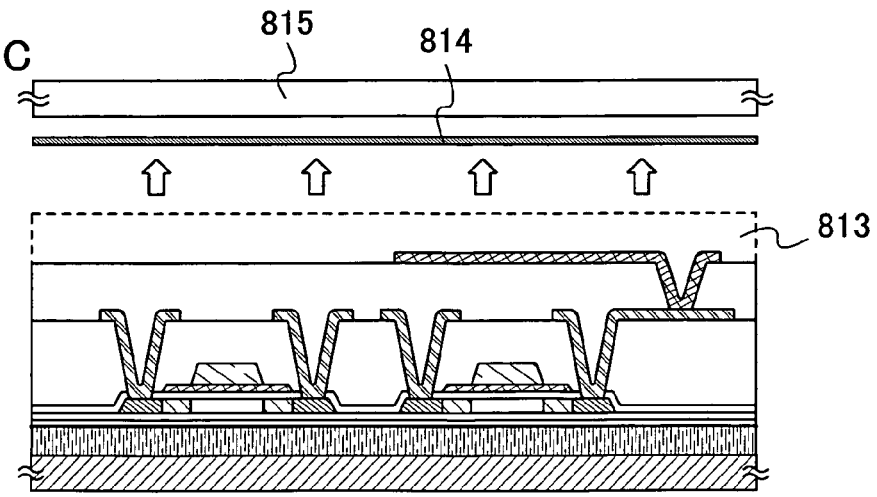

Next, as shown in FIG. 9C, the couple-face tape 814 and the second substrate 815 are detached from the protective layer 813 and then the protective layer 813 is removed, thereby transposing the semiconductor integrated circuit to the flexible substrate 818 can be completed. Alternatively, the protective layer 813 may be used without being removed. For example, a contact hole can be formed in the protective layer 813 to form a connecting terminal. Further, after removing the protective layer 813, an insulating film may be formed and then the contact hole may be formed.

In this embodiment, the two peeling steps are performed for transposing the semiconductor integrated circuit to the flexible substrate, though the invention is not limited to this. For example, instead of the second substrate, an object on which the ID chip is mounted may be used to peel off the substrate 800 in the peeling step. According to this, by one peeling step, the ID chip can be transposed to the object, namely a label, a card body, a container of goods and the like. Alternatively, an object on which the ID chip is mounted can be used instead of the flexible substrate. In that case, by two peeling steps, the ID chip can be transposed to the object such as a label, a card body, and a container of goods.

The ID chip of the invention, which is formed on an inexpensive substrate such as a glass substrate, can be provided at lower cost than a chip formed on a silicon wafer. A chip formed on a circular silicon wafer has a limit in the form of a substrate. Meanwhile, the ID chip formed on an insulating substrate such as a glass substrate does not have a limit in the form. Therefore, productivity can be enhanced and the geometry of the ID chip can be freely determined.

In terms of a material, the ID chip of the invention is formed of a less expensive and more safe material as compared with a chip formed on a silicon wafer. Thus, the necessity of collecting the used ID chip is decreased, which is good for the environment.

An IC chip formed on a silicon wafer may have a problem in its sensitivity to signals due to radio wave absorption caused by the silicon wafer. In particular, the problem of the radio wave absorption is concerned in the case of a normally used frequency of 13.56 MHz or 2.45 GHz. On the other hand, the ID chip of the invention, which is formed on an insulating substrate such as a glass substrate, does not cause radio wave absorption. As a result, a high sensitive ID chip can be achieved, thus an antenna of the ID chip of the invention can be reduced in area and miniaturization of the ID chip can be expected.

An IC chip formed on a silicon wafer with semiconductivity has a junction that is easily forward-biased with respect to AC radio waves, which requires measures for latch up. On the other hand, the ID chip of the invention that includes a thin film integrated circuit formed on an insulating substrate does not have such a problem.

This embodiment can be implemented in combination with other embodiments.

Embodiment 5

Described in this embodiment is a manufacturing method of a semiconductor integrated circuit included in the ID chip of the invention, and in particular a peeling step different from that in the aforementioned embodiments. The other steps and configurations are the same as those described in the aforementioned embodiments, therefore, a thin film transistor and the like are denoted by the same reference numerals and will be described in no more details.

Figure 12A:
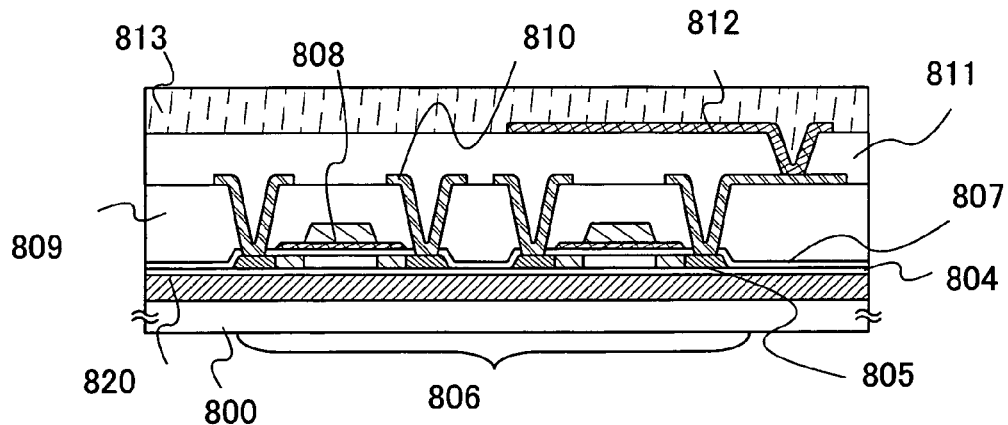
FIGS. 12A to 12D show diagrams showing steps of manufacturing an ID chip including a peeling step.

As shown in FIG. 12A, a peeling layer 820 is formed on the substrate 800, and a plurality of ID chips including semiconductor integrated circuits are formed thereon with the base film 804 interposed therebetween.

The substrate 800 is an insulating substrate such as a glass substrate, a quartz substrate and an alumina substrate, a silicon wafer substrate, a plastic substrate with heat resistance to a process temperature in the subsequent steps, or the like. In that case, a base insulating film to prevent an impurity or the like from diffusing from the substrate side may be formed using silicon oxide ($SiO_x$), silicon nitride ($SiN_x$), silicon oxynitride ($SiO_xN_y$) (x>y), silicon nitride oxide ($SiN_xO_y$) (x>y) (x, y=1, 2, . . . ), and the like. Alternatively, a substrate may be formed of metal such as stainless or semiconductor whose surface is covered with an insulating film such as silicon oxide and silicon nitride.

The peeling layer 820 is provided between the substrate 800 and the semiconductor integrated circuit, and removed in the subsequent step to separate the substrate 800 from the semiconductor integrated circuit. The peeling layer 820 is a layer mainly containing silicon (Si) such as amorphous silicon, polycrystalline silicon, single crystalline silicon, or SAS (semi-amorphous silicon, also called microcrystalline silicon).

When the peeling layer 820 is formed by using a layer mainly containing silicon (Si), it can be easily removed by a gas or a liquid containing $ClF_3$ (chlorine trifluoride) since fluorine halide such as $ClF_3$ has the properties of selectively etching silicon.

The base film 804 is formed between the peeling layer 820 and the semiconductor integrated circuit in order to protect the semiconductor integrated circuit from being etched with fluorine halide such as $ClF_3$. The fluorine halide such as $ClF_3$ has the properties of selectively etching silicon while hardly etching silicon oxide ($SiO_x$), silicon nitride ($SiN_x$), silicon oxynitride ($SiO_xN_y$), and silicon nitride oxide ($SiN_xO_y$). Accordingly, the peeling layer 820 is etched over time, while the base film 804 formed of silicon oxide, silicon nitride, silicon oxynitride, or silicon nitride oxide is hardly etched, which prevents the semiconductor integrated circuit from being damaged.

As long as the peeling layer comprises a material that can be etched by fluorine halide such as $ClF_3$ and the base film comprises a material that can not be etched by fluorine halide such as $ClF_3$, materials of the peeling layer and the base film are not limited to the aforementioned ones, and may be selected arbitrarily.

Figure 12B:
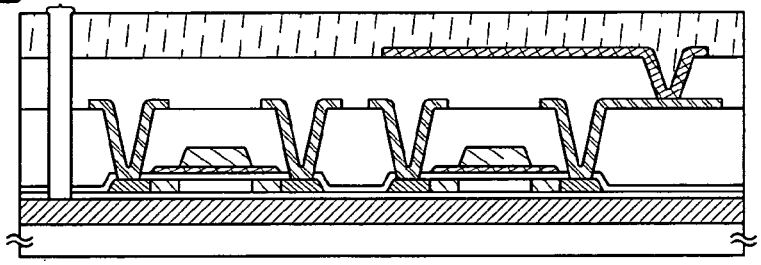

As shown in FIG. 12B, a trench 821 is formed to separate a plurality of ID chips.

The trench 821 separating semiconductor integrated circuits can be formed by dicing, scribing, or etching with the use of a mask. In the case of dicing, blade dicing using a dicer is generally performed. The blade is a grinding wheel containing diamond abrasive grains and has a width of about 30 to 50 µm. The semiconductor integrated circuits are separated by rotating the blade at high speed. In the case of scribing, diamond scribing, laser scribing or the like is performed. In the case of etching, dry etching, wet etching or the like is performed by using a mask pattern obtained by exposure and development, thereby elements can be separated. When dry etching is performed, atmospheric pressure plasma may be adopted.

Figure 12C:
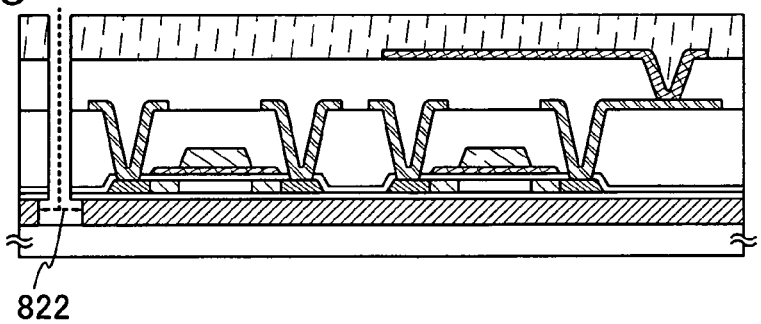

As shown in FIG. 12C, gas or liquid 822 containing fluorine halide is introduced into the trench 821 to remove the peeling layer 820.

As fluorine halide, a mixed gas of the $ClF_3$ added with nitrogen may also be used. The $ClF_3$ may be a liquid (boiling point of 11.75° C.) depending on a temperature in the reaction space. In that case, wet etching may also be performed. Note that $ClF_3$ can be synthesized by reacting chlorine with fluorine at a temperature of 200° C. or more through the following process: $CL_2(g)+3F_2(g) \rightarrow 2ClF_3(g)$. The etchant is not limited to $ClF_3$ and fluorine halide, and any etchant can be used as long as it etches the peeling layer 820 and does not etch the base film 804.

Figure 12D:
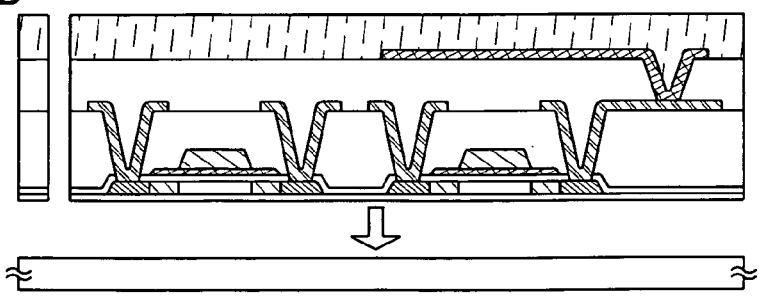

Then, as shown in FIG. 12D, the peeling layer 820 is etched with time and the substrate 800 can be eventually peeled off. On the other hand, since the base film 804, the first interlayer insulating film 809, and the second interlayer insulating film 811 that are formed of silicon oxide, silicon nitride, silicon oxynitride, silicon nitride oxide, or heat resistant resin are hardly etched, it prevents the semiconductor integrated circuit from being damaged. Further, the peeled substrate 800 can be reused, resulting in reduction in cost. In the case of the substrate being reused, the substrate is desirably controlled so as not to be damaged in the dicing, the scribing or the like. However, even if the substrate is damaged, it may be planarized by depositing organic resin or inorganic resin by an application method or a droplet discharging method (ink jet method and the like).

It is preferable to provide the protective layer 813 over the semiconductor integrated circuit in order to protect the semiconductor integrated circuit from being etched by fluorine halide and the like. In particular, in the case of etching being performed such as by low pressure CVD in which fluorine halide gas is heated, a heat resistant organic resin or a heat resistant inorganic resin is preferably used. The heat resistant organic resin typically includes a material that has a backbone structure obtained by binding silicon to oxygen and has at least a hydrogen substituent, or a material that has one or more substituents selected from fluorine, an alkyl group, and aromatic hydrocarbon. Such a heat resistant organic resin is also called a siloxane-based resin.

In this embodiment, a jig may be formed over a plurality of semiconductor integrated circuits with an adhesive, and gas or liquid containing fluorine halide may be introduced into the trench.

The jig is a supporting substrate for temporarily fixing the semiconductor integrated circuits so as not to be separated after the peeling layer is removed. The jig is provided for each element group constituting one chip or one semiconductor integrated circuit, or for each element group constituting a plurality of semiconductor integrated circuits stacked horizontally or vertically. A comb-like jig with projections is desirably used in order to facilitate the introduction of gas or liquid containing fluorine halide, though a flat jig may also be employed. As a material of the jig, a glass substrate, a quartz substrate, a stainless (SUS) substrate and the like each mainly containing silicon oxide that is not affected by fluorine halide can be used, though any material that is not affected by fluorine halide may be used.

An adhesive for temporary adhesion is provided between the jig and the semiconductor integrated circuits. As the adhesive, a material whose adhesion is decreased or lost by UV ray irradiation can be employed. Alternatively, a repeelable and readherable adhesive can be used such as products of 3M Post-it® and products of Moore USA Inc. NOTESTIX®. It is needless to say that any material can be used as long as the jig can be easily detached.

In this embodiment, a heat resistant insulating film may be formed over the semiconductor integrated circuits and then a trench may be formed on boundaries of the semiconductor integrated circuits.

The heat resistant insulating film are a material that has a backbone structure obtained by binding silicon to oxygen and has at least a hydrogen substituent, a material that has one or more substituents selected from fluorine, an alkyl group, and aromatic hydrocarbon, namely a heat resistant organic resin such as a siloxane-based resin, or a heat resistant inorganic material.

According to the peeling method shown in this embodiment, a plurality of semiconductor integrated circuits can be certainly peeled off from a substrate by a chemical method using fluorine halide. Therefore, the peeling method shown in this embodiment is more preferable as compared with a physical method of adding stress to a substrate to physically peel off a plurality of semiconductor integrated circuits from the substrate.

Figure 15A:
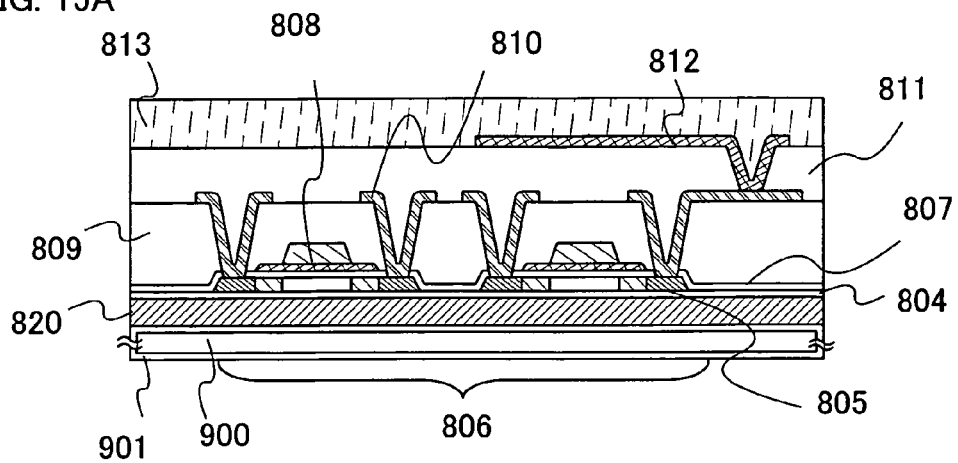
FIGS. 15A to 15C show diagrams showing steps of manufacturing an ID chip including a peeling step.
Figure 15B:
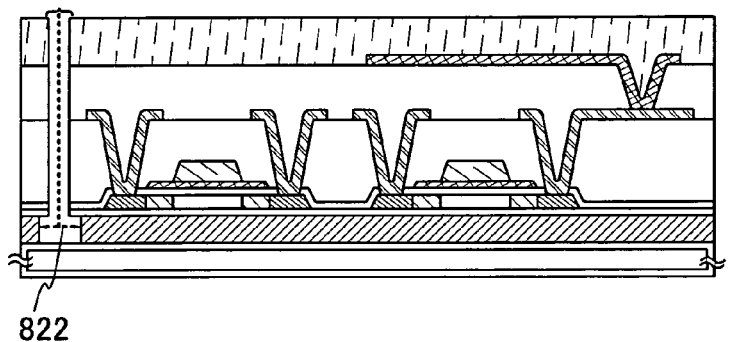
Figure 15C:
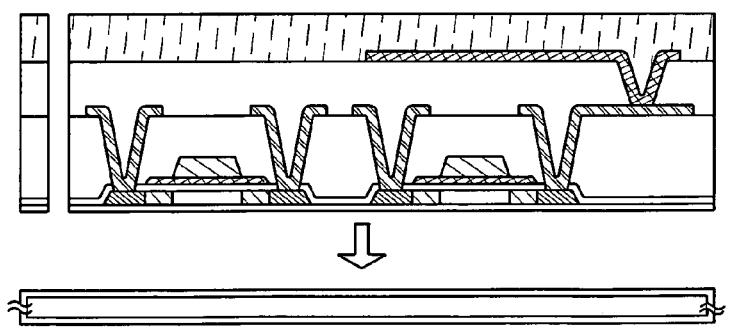

As set forth above, a substrate may be formed of metal such as stainless or semiconductor whose surface is covered with an insulating film such as silicon oxide and silicon nitride. For example, as shown in FIG. 15A, a Si wafer 900 covered with a silicon oxide film 901 obtained by thermal oxidization and the like can be used as a substrate. Then, as shown in FIG. 15B, the gas or liquid 822 containing fluorine halide is introduced into the trench 821 to remove the peeling layer 820. As a result, the substrate 900 can be eventually peeled off as shown in FIG. 15C.

Alternatively, a Si wafer on which a silicon oxide film or the like is formed may be used as a substrate. For example, oxygen is added to a Si wafer from above at high speed, thereby a silicon oxide film is formed in a predetermined area. In that case, the Si wafer is etched by fluorine halide such as $ClF_3$ (chlorine trifluoride) or mechanically polished to be removed. In addition, single crystalline silicon is formed on the silicon oxide film or the like, therefore, a transistor with single crystalline silicon can be obtained.

In the case of a single crystalline silicon film being used, miniaturization of a semiconductor integrated circuit can be achieved more easily than in the case of a crystalline semiconductor film being used.

The semiconductor integrated circuit peeled off in this manner can be transposed as is in the aforementioned embodiments.

Embodiment 6

Described in this embodiment is the case in which different wirings connected to memory cells in each substrate are formed without using a photomask but by using the ink jet method.

First, a manufacturing method of a TFT configuring a memory cell is briefly described with reference to FIGS. 10A to 10D. A base film 1001 and a semiconductor film are formed over a substrate 1000. The semiconductor film is crystallized by laser light and then patterned to form an island-like semiconductor film 1002. Then, a gate insulating film 1003 is formed so as to cover the island-like semiconductor film 1002. On the gate insulating film 1003, a conductive film is formed and then patterned to form a gate electrode 1004. Subsequently, an impurity is added to the semiconductor film 1002 to obtain a source region and a drain region. An interlayer insulating film 1005 is formed so as to cover a TFT. After forming contact holes 1006 and 1007 in the gate insulating film 1003 and the interlayer insulating film 1005, metal wirings of a bit line 1008, a VDD 1009, and a GND 1010 are formed. The bit line 1008 is formed so as to be connected to the semiconductor film 1002 via the contact hole 1006, while a wiring 1011 is formed over the contact hole 1007 so as not to be short-circuited to anywhere. The TFT can be formed by the aforementioned steps, though a manufacturing method thereof is not limited to these.

Figure 10A:
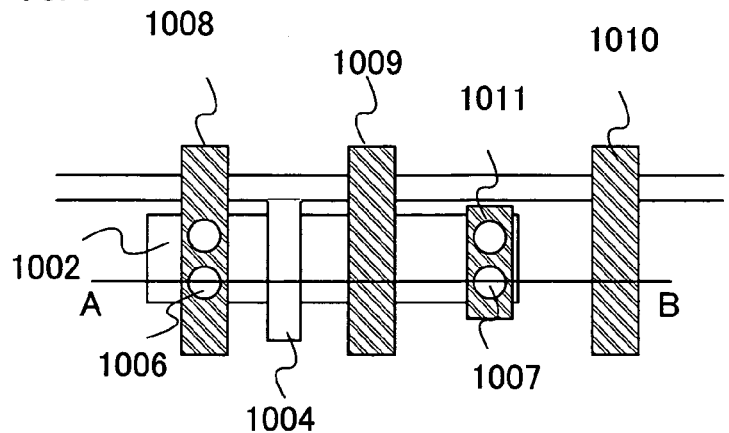
FIGS. 10A to 10D show diagrams showing steps of drawing a metal wiring by an ink jet method.
Figure 10B:
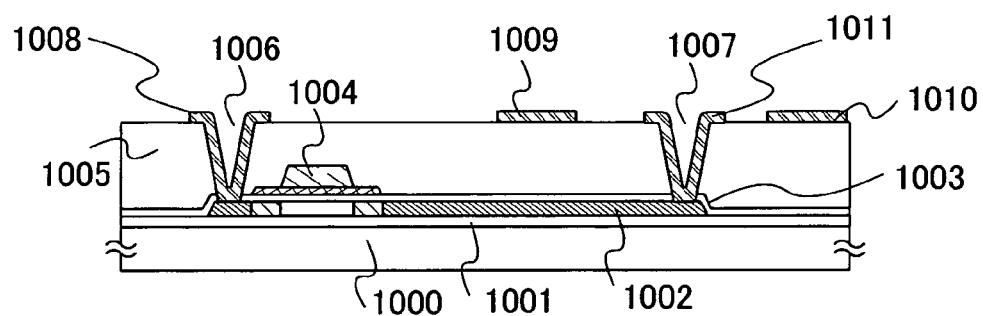

FIG. 10A shows a memory cell layout in the case where data content of a ROM in the memory cell formed in the aforementioned manner is determined by the ink jet method. FIG. 10B is a cross sectional view obtained by cutting along a line A-B of FIG. 10A.

Steps of determining the data content by the ink jet method are described hereinafter. For example, data is 0 in the case of a potential read from the memory cell being GND while data is 1 in the case of a read potential being VDD. When data 0 is required, the GND 1010 may be short-circuited to the wiring 1011 that is formed over the contact hole 1007 and is not short-circuited to anywhere by the ink jet method as the following.

In the case of drawing a metal wiring by the ink jet method, a preparatory step may be performed for increasing the adhesiveness of the metal wiring. For example, the metal wiring is irradiated by UV rays before forming another metal wiring. Instead, a base film may be formed by using titanium oxide (TiOx) and the like. Such a preparatory step allows the adhesiveness of the metal wiring to be increased, thereby a metal wiring drawn by the ink jet method can be peeled off with difficulty. In addition, miniaturization of the metal wiring can be achieved.

Figure 10C:
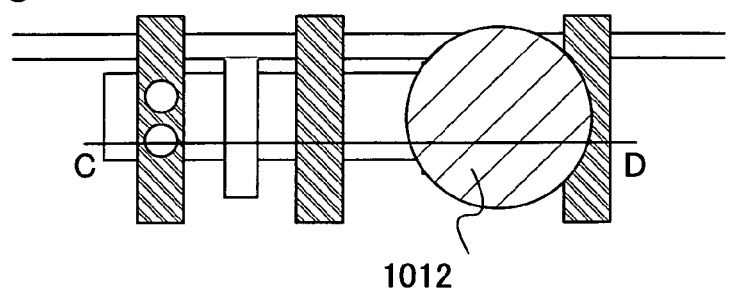
Figure 10D:
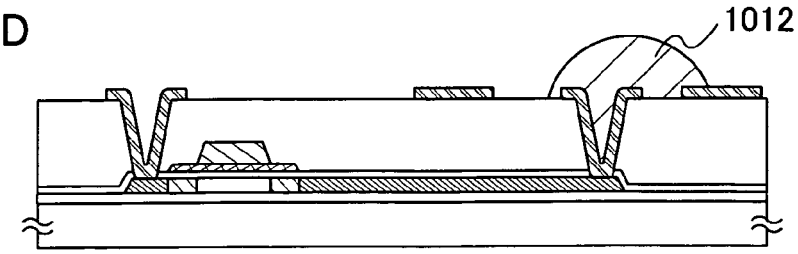

Subsequently, as shown in FIGS. 10C and 10D, a metal wiring 1012 is drawn by the ink jet method so that the GND 1010 may be short-circuited to the wiring 1011 that is formed over the contact hole 1017 and is not short-circuited to anywhere. FIG. 10D is a cross sectional view obtained by cutting along a line C-D of FIG. 10C. According to the ink jet method, a material of the metal wiring is dispersed into an organic or inorganic solvent, and the solvent is ejected from a nozzle, then dried or baked. The solvent can be ejected under an atmospheric pressure or a reduced pressure.

In the case of the ink jet method being adopted, patterning accuracy depends on the ejection rate per droplet, the surface tension of the solution, the water-shedding properties of the surface of the substrate to which a droplet is ejected, and the like. Therefore, these conditions are preferably optimized in accordance with a predetermined patterning accuracy.

When data 1 is required, similarly, the VDD 1009 may be short-circuited to the wiring 1011 that is formed over the contact hole 1007 and is not short-circuited to anywhere by the ink jet method. In this manner, data content of a ROM can be determined by the ink jet method.

This embodiment can be implemented in combination with other embodiments.

Embodiment 7

Described in this embodiment is a final drawing of the ID chip of the invention.

Figure 13A:
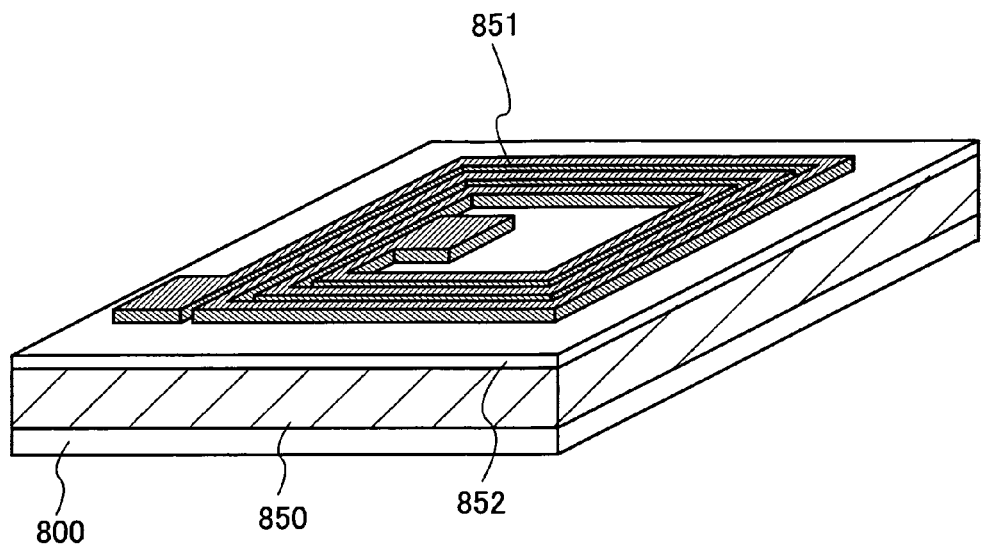
FIGS. 13A and 13B show final drawings of an ID chip.

As shown in FIG. 13A, an area (semiconductor integrated circuit area) 850 having a semiconductor integrated circuit and the like is formed over the substrate 800. The semiconductor integrated circuit and the like can be obtained in accordance with the aforementioned embodiments. An antenna 851 is formed over the semiconductor integrated circuit area 850 with an insulating film 852 interposed therebetween. The antenna 851 may be formed by the droplet discharging method and the like. As the insulating film 852, the protective layer 813 described in the aforementioned embodiments can be used for example. The antenna 851 is required to be connected to the semiconductor integrated circuit. Therefore, for example, a contact hole is formed in the insulating film 852 so that a connecting terminal of the antenna 851 may be connected to a pad of the semiconductor integrated circuit. At this time, a conductive resin may also be used for connection.

Figure 13B:
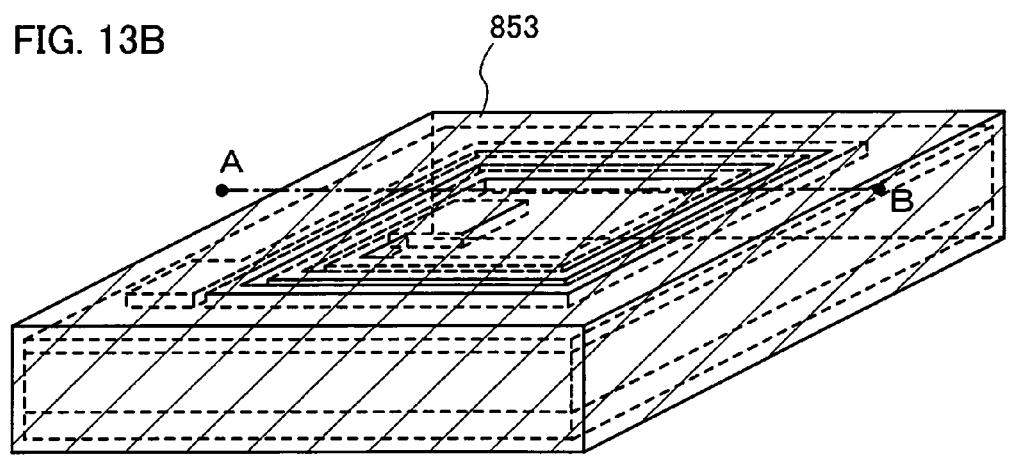

Then, as shown in FIG. 13B, an insulating film 853 functioning as a protective film is formed so as to cover the semiconductor integrated circuit and the antenna 851. The insulating film 853 may be formed of an organic material or an inorganic material. As a result, the semiconductor integrated circuit can be protected from outside, and an easily portable ID chip can be completed. Further, the insulating film 853 can assiat a function to the semiconductor integrated circuit.

Figure 14A:
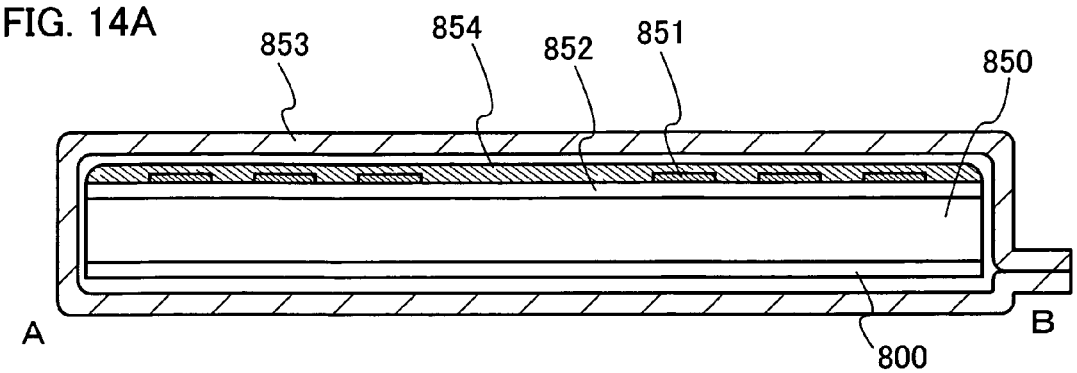
FIGS. 14A to 14C show cross sectional views of final drawings of an ID chip.

FIG. 14A is a cross sectional view obtained by cutting along a line A-B in FIG. 13B. The semiconductor integrated circuit area 850, the insulating film 852, the antenna 851, and the insulating film 854 functioning as a protective film are sequentially stacked over the substrate 800, and the insulating film 853 is formed so as to cover these components. As set forth above, a contact hole is formed in the insulating film so that a connecting terminal of the antenna may be connected to a pad of the semiconductor integrated circuit, thereby the antenna and the semiconductor integrated circuit can be connected (not shown).

By forming the antenna over the semiconductor integrated circuit, miniaturization of the ID chip can be achieved.

In addition, the ID chip can be completed by adopting any other configuration than those shown in FIG. 13 and FIG. 14A.

Figure 14B:
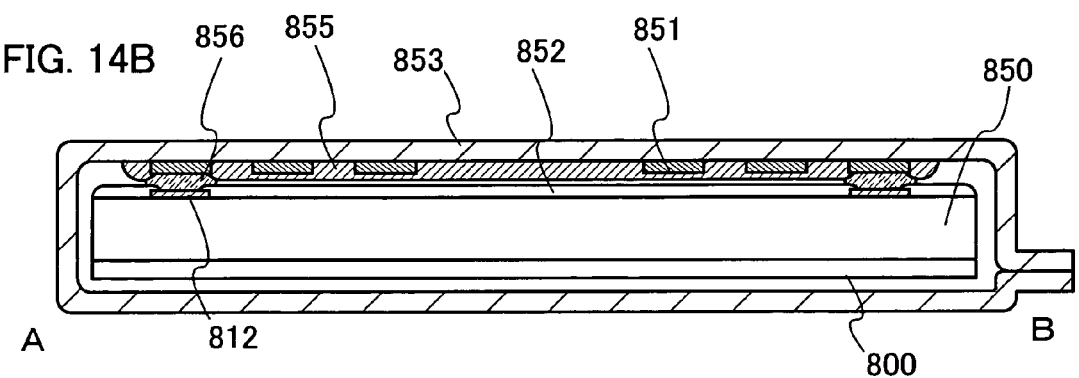

For example, as shown in FIG. 14B, the antenna 851 may be formed on the insulating film 853 side. The antenna 851 is covered with an insulating film 855 functioning as a protective film, and has a contact hole in an area connected to the semiconductor integrated circuit. On the semiconductor integrated circuit side, the insulating film 852 over the pad 812 has a contact hole in an area connected to the antenna 851. The pad 812 of the semiconductor integrated circuit can be connected to the antenna 851 via a conductive resin 856.

When the antenna 851 is formed on the insulating film 853 side and separated from the semiconductor integrated circuit in this manner, yield can be improved.

Figure 14C:
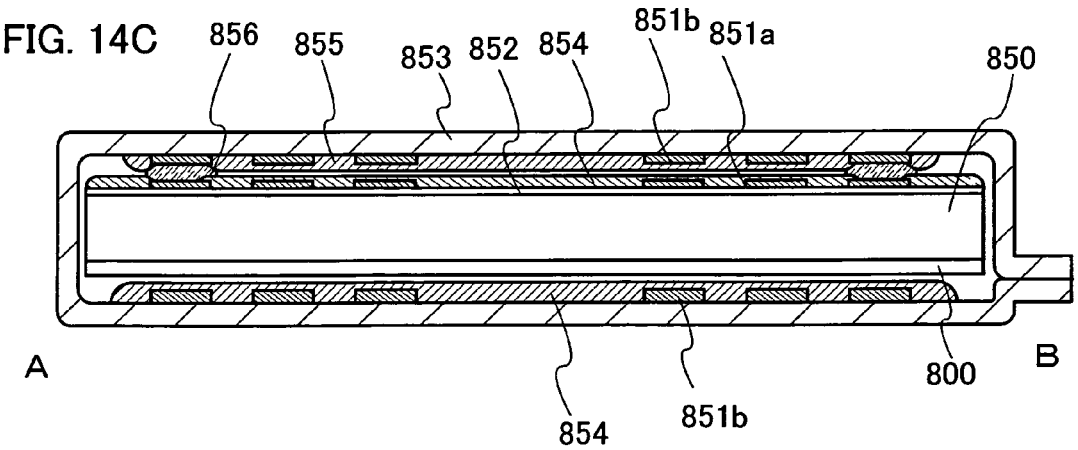

Further, as shown in FIG. 14C, an antenna 851a over the semiconductor integrated circuit and an antenna 851b formed on the insulating film 853 side can be formed so as to face each other. In that case, the insulating film 854 covering the antenna 851a has a contact hole in an area connected to the antenna 851b, and the insulating film 855 covering the antenna 851b has a contact hole in an area connected to the antenna 851a. Thus, the antenna 851a and the antenna 851b can be connected via the conductive resin 856.

When the antennas are formed in many areas in this manner, a high sensitive ID chip can be achieved.

As described above, the ID chip can adopt various configurations.

Embodiment 8

Described in this embodiment are applications of the ID chip of the invention.

Figure 11A:
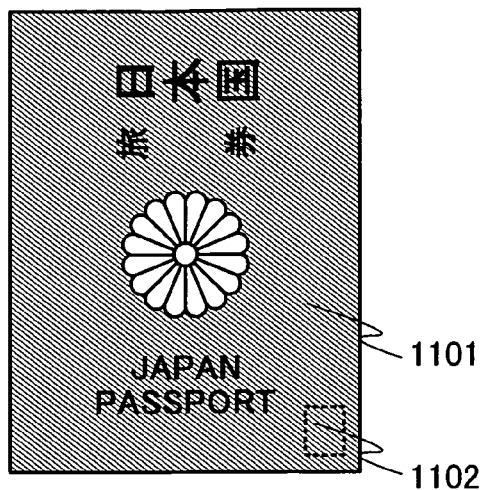
FIGS. 11A to 11C show views showing application examples of the ID chip of the invention.

Since the ID chip of the invention includes a nonvolatile memory in which data cannot be rewritten, it can be mounted on securities, checks, family registers, resident cards, passports and the like to prevent forgery thereof. FIG. 11A shows an example of a passport 1101 including the ID chip of the invention. In FIG. 11A, an ID chip 1102 is mounted within a front cover of the passport 1101, though it may be mounted on other pages of the passport 1101.

Figure 11B:
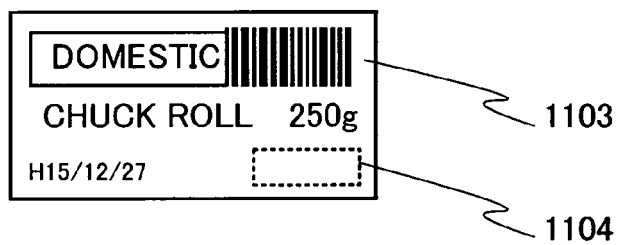

Since the ID chip of the invention is inexpensive and small, it is effectively used as the disposable one. In particular, the inexpensive ID chip of the invention is quite effective for a product increase in the price of which even by a few yens or a few tens of yens has a great effect on sales. FIG. 11B shows a display label 1103 including the ID chip of the invention. An ID chip 1104 may be exposed on a surface of the display label 1103 or mounted directly on a product. When the price of the product is written to the ID chip 1104 as data, the product can be paid at the cash register even in the case of the distance between the product and the cash register being longer than in the case of a conventional bar code being used, thereby stock management can be simplified and shoplifting can be prevented.

Figure 11C:
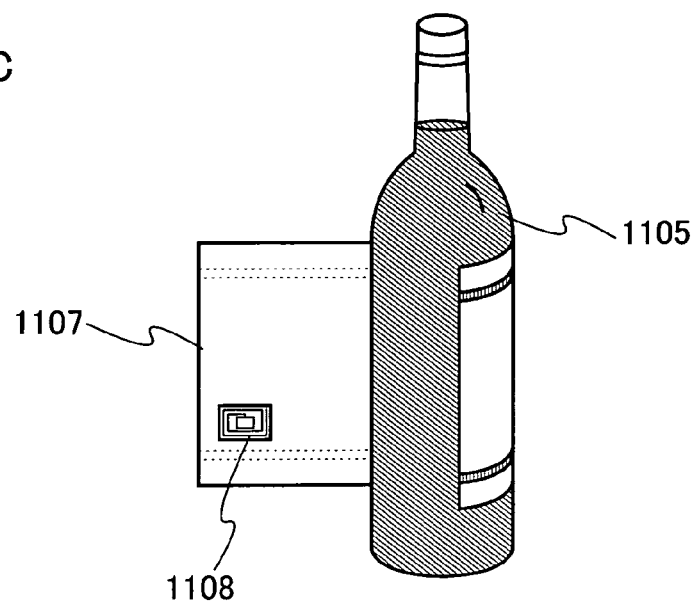

The ID chip transposed to a flexible substrate can be changed in form to some extent in accordance with the form of an object to which the ID chip is attached. For example, as shown in FIG. 11C, when a product label 1107 is attached to a cylindrical bottle 1105, a flexible ID chip 1108 of the invention can be effectively used.

The application range of the ID chip of the invention is not limited to the one shown in this embodiment, and other various applications are possible.

This embodiment can be implemented in combination with other embodiments. This application is based on Japanese Patent Application serial no. 2003-423841 filed in Japan Patent Office on Dec. 19th, 2003, the contents of which are hereby incorporated by reference.

What is claimed is:

1. A semiconductor device comprising:
    a semiconductor integrated circuit comprising:
        an insulating substrate;
        a memory cell formed over the insulating substrate and connected to a wiring including a cut portion obtained by laser cutting; and
        a connecting terminal, and
    an antenna that is connected to the connecting terminal and formed over the semiconductor integrated circuit.

2. A semiconductor device according to claim 1, wherein the insulating substrate is one of a glass substrate and a flexible substrate.

3. A semiconductor device according to claim 1, wherein the antenna includes gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), aluminum (Al), or an alloy of them.

4. A card comprising a semiconductor device according to claim 1.

5. A tag comprising a semiconductor device according to claim 1.

6. A semiconductor device comprising:
    a semiconductor integrated circuit comprising:
        a first read only memory that includes a memory cell connected to a wiring formed by a photomask;
        a second read only memory connected to a wiring including a cut portion obtained by laser cutting; and
        a connecting terminal,
        wherein the first read only memory and the second read only memory are formed on an insulating substrate, and
    an antenna that is connected to the connecting terminal and formed over the semiconductor integrated circuit.

7. A semiconductor device according to claim 6, wherein the insulating substrate is one of a glass substrate and a flexible substrate.

8. A semiconductor device according to claim 6, wherein the antenna includes gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), aluminum (Al), or an alloy of them.

9. A card comprising a semiconductor device according to claim 6.

10. A tag comprising a semiconductor device according to claim 6.

11. A semiconductor device comprising:
    a semiconductor integrated circuit comprising:
        an insulating substrate;
        a read only memory over the insulating substrate including a memory cell connected to a wiring; and
        a connecting terminal,
        wherein the wiring comprise aggregate of grains formed by a plurality of metal particles, and
    an antenna that is connected to the connecting terminal and formed over the semiconductor integrated circuit.

12. A semiconductor device according to claim 11, wherein the metal particles comprise at least one material selected from the group consisting of gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), aluminum (Al), and an alloy of them.

13. A semiconductor device comprising:
    a semiconductor integrated circuit comprising:
        an insulating substrate;
        a memory cell formed over the insulating substrate, the memory cell comprising a thin film transistor;
        a first wiring connected to a source of the thin film transistor;
        a second wiring connected to a drain of the thin film transistor; and
        a connecting terminal,
        wherein at least one of the first wiring and the second wiring includes a cut portion obtained by laser cutting, and
    an antenna that is connected to the connecting terminal and formed over the semiconductor integrated circuit.

14. A semiconductor device according to claim 13, wherein one of the first wiring and the second wiring is connected to a VDD, and the other is cut so as to be disconnected to a GND.

15. A semiconductor device according to claim 13, wherein one of the first wiring and the second wiring is connected to a GND, and the other is cut so as to be disconnected to a VDD.

16. A semiconductor device according to claim 13, wherein the insulating substrate is one of a glass substrate and a flexible substrate.

17. A semiconductor device according to claim 13, wherein the antenna includes gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), aluminum (Al), or an alloy of them.

18. A card comprising a semiconductor device according to claim 13.

19. A tag comprising a semiconductor device according to claim 13.

20. A semiconductor device comprising:
    a semiconductor integrated circuit comprising:
        a first read only memory that includes a memory cell connected to a wiring formed by a photomask;
        a second read only memory comprising a thin film transistor;
        a first wiring connected to a source of the thin film transistor;
        a second wiring connected to a drain of the thin film transistor; and
        a connecting terminal,
        wherein at least one of the first wiring and the second wiring includes a cut portion obtained by laser cutting, and
        wherein the first read only memory and the second read only memory are formed on an insulating substrate, and
    an antenna that is connected to the connecting terminal and formed over the semiconductor integrated circuit.

21. A semiconductor device according to claim 20, wherein one of the first wiring and the second wiring is connected to a VDD, and the other is cut so as to be disconnected to a GND.

22. A semiconductor device according to claim 20, wherein one of the first wiring and the second wiring is connected to a GND, and the other is cut so as to be disconnected to a VDD.

23. A semiconductor device according to claim 20, wherein the insulating substrate is one of a glass substrate and a flexible substrate.

24. A semiconductor device according to claim 20, wherein the antenna includes gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), aluminum (Al), or an alloy of them.

25. A card comprising a semiconductor device according to claim 20.

26. A tag comprising a semiconductor device according to claim 20.

* * * * *